United States Patent
McNutt et al.

(10) Patent No.: US 10,102,946 B1
(45) Date of Patent: Oct. 16, 2018

(54) METHODS FOR MANUFACTURING DISCONTINUOUS SHIELD STRUCTURES FOR USE IN COMMUNICATION CABLES

(71) Applicant: Superior Essex International LP, Atlanta, GA (US)

(72) Inventors: Christopher W. McNutt, Woodstock, GA (US); Amir Sekhavat, Marietta, GA (US)

(73) Assignee: Superior Essex International LP, Atlanta, GA (US)

( * ) Notice: Subject to any disclaimer, the term of this patent is extended or adjusted under 35 U.S.C. 154(b) by 255 days.

(21) Appl. No.: 14/879,367

(22) Filed: Oct. 9, 2015

(51) Int. Cl.
| | |
|---|---|
| *H01B 13/08* | (2006.01) |
| *H01B 13/26* | (2006.01) |
| *H01B 11/06* | (2006.01) |
| *H01B 13/06* | (2006.01) |
| *H01B 13/00* | (2006.01) |
| *H01B 11/10* | (2006.01) |
| *H01B 11/04* | (2006.01) |

(52) U.S. Cl.
CPC ......... *H01B 13/06* (2013.01); *H01B 13/0026* (2013.01); *H01B 11/04* (2013.01); *H01B 11/06* (2013.01); *H01B 11/10* (2013.01); *Y10T 156/1057* (2015.01); *Y10T 156/1062* (2015.01); *Y10T 156/1067* (2015.01); *Y10T 156/1085* (2015.01); *Y10T 156/1087* (2015.01)

(58) Field of Classification Search
None
See application file for complete search history.

(56) References Cited

U.S. PATENT DOCUMENTS

| | | | |
|---|---|---|---|
| 2,538,019 A | 1/1951 | Edwin | |
| 2,796,463 A | 6/1957 | Mallinckrodt | |
| 3,090,825 A | 5/1963 | Volk | |
| 3,135,935 A | 6/1964 | Eugelbrecht | |

(Continued)

FOREIGN PATENT DOCUMENTS

| | | |
|---|---|---|
| GB | 2432963 | 6/2007 |
| JP | 200090748 | 3/2000 |

(Continued)

OTHER PUBLICATIONS

Machine translation of disclosure of JP 2015-38857, Baeck et al., Feb. 26, 2015.*

(Continued)

*Primary Examiner* — Linda L Gray

(57) ABSTRACT

Methods for forming discontinuous shields or shield structures for use in a cable are provided. A layer of dielectric material may be provided that extends in a longitudinal direction and has a first width across a width direction perpendicular to the longitudinal direction. Additionally, a layer of electrically conductive material may be formed on the dielectric material, and the layer of electrically conductive material may extend in the longitudinal direction and may have a second width across the width direction that is less than the first width. Respective gaps may be formed through both the electrically conductive material at a plurality of locations along the longitudinal direction, and each gap may span across the width direction by a distance greater than the second width but less than the first width.

20 Claims, 13 Drawing Sheets

(56) References Cited

U.S. PATENT DOCUMENTS

| | | | |
|---|---|---|---|
| 3,312,774 A | | 4/1967 | Drinko |
| 3,373,475 A | | 3/1968 | Petersen |
| 3,424,636 A | * | 1/1969 | Brody ................ B42D 3/12 156/201 |
| 3,439,111 A | | 4/1969 | Roland |
| 3,612,744 A | | 10/1971 | Thomas |
| 4,129,641 A | | 12/1978 | Hildebrand et al. |
| 4,153,496 A | * | 5/1979 | Swift ................ B31D 1/021 156/248 |
| 4,327,246 A | | 4/1982 | Kincaid |
| 4,604,497 A | | 8/1986 | Bell et al. |
| 4,638,272 A | | 1/1987 | Ive |
| 4,746,767 A | | 5/1988 | Gruhn |
| 4,818,312 A | * | 4/1989 | Benge ................ B32B 38/0004 156/269 |
| 4,855,534 A | | 8/1989 | O'Connor |
| 4,881,642 A | | 11/1989 | Adam |
| 4,912,283 A | | 3/1990 | O'Connor |
| 5,006,806 A | | 4/1991 | Rippingale |
| 5,008,489 A | | 4/1991 | Weeks et al. |
| 5,106,175 A | | 4/1992 | Davis et al. |
| 5,114,517 A | | 5/1992 | Rippingale et al. |
| 5,473,336 A | | 12/1995 | Harman et al. |
| 5,952,615 A | | 9/1999 | Prudhon |
| 5,956,445 A | | 9/1999 | Deitz et al. |
| 6,203,652 B1 | * | 3/2001 | Egitto ................ H05K 3/0032 156/247 |
| 6,207,901 B1 | | 3/2001 | Smith et al. |
| 6,506,976 B1 | | 1/2003 | Neveux |
| 6,677,518 B2 | | 1/2004 | Hirakawa et al. |
| 6,687,437 B1 | | 2/2004 | Starnes et al. |
| 6,723,925 B2 | | 4/2004 | Ohara et al. |
| 6,737,574 B2 | | 5/2004 | Sylvia et al. |
| 6,770,819 B2 | | 8/2004 | Patel |
| 6,831,231 B2 | | 12/2004 | Perelman et al. |
| 6,850,161 B1 | | 2/2005 | Elliot |
| 6,888,070 B1 | | 5/2005 | Prescott |
| 7,173,189 B1 | | 2/2007 | Hazy et al. |
| 7,179,999 B2 | | 2/2007 | Clark et al. |
| 7,208,683 B2 | | 4/2007 | Clark |
| 7,332,676 B2 | | 2/2008 | Sparrowhawk |
| 7,335,837 B2 | | 2/2008 | Pfeiler et al. |
| 7,600,723 B2 | | 10/2009 | Borchers |
| 7,834,270 B2 | | 11/2010 | Zhu et al. |
| 7,923,632 B2 | | 4/2011 | Smith et al. |
| 7,923,641 B2 | | 4/2011 | Smith et al. |
| 8,119,906 B1 | | 2/2012 | Smith et al. |
| 8,445,787 B2 | | 5/2013 | Nordin et al. |
| 8,558,115 B2 | | 10/2013 | Jenner et al. |
| 8,696,855 B2 | * | 4/2014 | Ellingson .......... A61F 13/15723 156/253 |
| 9,767,939 B2 | | 9/2017 | Hess |
| 2003/0051806 A1 | * | 3/2003 | Appalucci ................ B32B 38/10 156/270 |
| 2005/0118391 A1 | | 6/2005 | Kavvadias et al. |
| 2006/0048961 A1 | | 3/2006 | Pfeiler et al. |
| 2007/0037419 A1 | | 2/2007 | Sparrowhawk |
| 2007/0224495 A1 | | 9/2007 | Gibbons et al. |
| 2007/0275583 A1 | | 11/2007 | McNutt et al. |
| 2008/0255435 A1 | | 10/2008 | Al-Ali et al. |
| 2008/0314636 A1 | | 12/2008 | Ogura |
| 2009/0200060 A1 | | 8/2009 | Smith et al. |
| 2009/0223694 A1 | | 9/2009 | Nordin et al. |
| 2009/0272571 A1 | | 11/2009 | Gromko |
| 2010/0096179 A1 | | 4/2010 | Sparrowhawk |
| 2010/0101853 A1 | | 4/2010 | McNutt |
| 2010/0224359 A1 | | 9/2010 | Jenner |
| 2010/0224389 A1 | | 9/2010 | Jenner et al. |
| 2011/0147039 A1 | | 6/2011 | Smith et al. |
| 2014/0238720 A1 | * | 8/2014 | Kroushl ................ H01B 11/04 174/113 R |
| 2016/0037691 A1 | | 2/2016 | Kroushl et al. |

FOREIGN PATENT DOCUMENTS

| | | | | |
|---|---|---|---|---|
| JP | 2006173044 | | 6/2006 | |
| JP | 2015038857 | * | 2/2015 | ......... H01B 11/1008 |
| WO | WO2006105166 | | 5/2006 | |

OTHER PUBLICATIONS

Notice of Allowance and Fee(s) Due in U.S. Appl. No. 14/578,921, dated Oct. 9, 2015.
Notice of Allowance and Fee(s) Due in U.S. Appl. No. 13/827,359, dated Oct. 2, 2015.
"Product Catalogue" 2 pages, Enterprise cabling R&M, May 2006.
"Draka" 12 pages, Draka Comteq, Cabe Solutions, Data Cables, Sep. 27, 2006.
"10 Gigabit Ethernet Solutions" 8 pages, R&M Convincing Cabling Solutions.
Wetzikon, "R&M: The Rising Stars in Copper Cabling" 2 pages, Sep. 1, 2005.
"R&M Star Real 10" 2 pages, Mar. 2006.
"Connections 29" 36 pages, Sep. 2005.
Pfeiler et al., U.S. Pat. No. 7,335,837, issued Feb. 26, 2008.
Non-Final Rejection for U.S. Appl. No. 13/827,257, dated Jan. 14, 2015.
Non-Final Rejection for U.S. Appl. No. 13/827,359, dated Aug. 7, 2014.
Final Offices Action for U.S. Appl. No. 13/827,359, dated Mar. 3, 2015.
Non-Final Rejection for U.S. Appl. No. 13/835,800, dated Feb. 19, 2015.
Office Action for U.S. Appl. No. 14/271,800, dated Sep. 16, 2015.
Office Action for U.S. Appl. No. 13/835,800, dated Jul. 9, 2015.
Notice of Allowance and Fee(s) Due in U.S. Appl. No. 13/835,600, dated Mar. 15, 2016.
Non-Final Office Action for U.S. Appl. No. 14/578,925, dated Aug. 1, 2017.
Office Action, dated Jan. 13, 2016, for U.S. Appl. No. 14/271,800.
Office Action, dated May 3, 2016, for U.S. Appl. No. 14/879,393.

* cited by examiner

METHODS FOR MANUFACTURING DISCONTINUOUS SHIELD STRUCTURES FOR USE IN COMMUNICATION CABLES

CROSS-REFERENCES TO RELATED APPLICATIONS

This application is related to pending U.S. patent application Ser. No. 14/879,393, filed Oct. 9, 2015 and entitled "Discontinuous Shield Structures for Use in Communication Cables", the contents of which is incorporated herein by reference in its entirety.

Additionally, this application is related to U.S. patent application Ser. No. 14/578,925, filed Dec. 22, 2014, and entitled "Shielding Elements for Use in Communication Cables"; U.S. patent application Ser. No. 14/578,921, filed Dec. 22, 2014, and entitled "Shielding Elements for Use in Communication Cables"; U.S. patent application Ser. No. 13/827,257, filed Mar. 14, 2013, and entitled "Segmented Shields for Use in Communication Cables"; U.S. patent application Ser. No. 13/827,359, filed Mar. 14, 2013, and entitled "Segmented Shields for Use in Communication Cables"; U.S. patent application Ser. No. 12/653,804, filed Dec. 19, 2008, and entitled "Communication Cable Having Electrically Isolated Shield Providing Enhanced Return Loss"; U.S. patent application Ser. No. 12/313,914 (Now U.S. Pat. No. 7,923,641), filed Nov. 25, 2008, and entitled "Communication Cable Comprising Electrically Isolated Patches of Shielding Material"; U.S. patent application Ser. No. 11/502,777, filed Aug. 11, 2006, and entitled "Method and Apparatus for Fabricating Noise-Mitigating Cable"; U.S. patent application Ser. No. 12/313,910 (Now U.S. Pat. No. 7,923,632), filed Nov. 25, 2008, and entitled "Communication Cable Comprising Electrically Discontinuous Shield Having Nonmetallic Appearance"; U.S. patent application Ser. No. 12/583,797 (Now U.S. Pat. No. 8,119,906), filed Aug. 26, 2009, and entitled "Communication Cable Shielded With Mechanically Fastened Shielding Elements"; U.S. patent application Ser. No. 12/584,672 (Now U.S. Pat. No. 8,119,907), filed Sep. 10, 2009, and entitled "Communication Cable With Electrically Isolated Shield Comprising Holes"; U.S. patent application Ser. No. 13/039,918, filed Mar. 3, 2011, and entitled "Communication Cable Comprising Electrically Discontinuous Shield Having Nonmetallic Appearance"; and U.S. patent application Ser. No. 13/039,923, filed Mar. 3, 2011, and entitled "Communication Cable Comprising Electrically Discontinuous Shield Having Nonmetallic Appearance". The entire contents of each of these matters are incorporated by reference herein.

TECHNICAL FIELD

Embodiments of the disclosure relate generally to communication cables and, more particularly, to discontinuous shield structures for use in communication cables and methods for manufacturing such discontinuous shield structures.

BACKGROUND

Many types of communication cables, such as twisted pair communication cables, incorporate shields in order to mitigate the effects of noise, interference, and crosstalk. Continuous shields, such as metallic shields that circumferentially encase conductors, must typically be grounded at both ends to prevent the shield from inadvertently carrying a voltage along its length that can lead to a shock hazards. Continuous shields can also set up standing waves of electromagnetic energy based on signals received from nearby energy sources. A standing wave can radiate electromagnetic energy, somewhat like an antenna, that may interfere with wireless communication devices or other sensitive equipment operating nearby. In order to address the limitations of continuous shields, segmented or discontinuous shields have been incorporated into certain cables. These segmented shields typically include metallic patches formed on a polymeric film, and electrical discontinuity (i.e., spaces or gaps) is maintained between the metallic patches. Thus, the patches function as an electromagnetic shield; however, it is not necessary to ground the shields during cable installation.

Current segmented shield designs are typically manufactured by applying a continuous metallic layer to a dielectric layer, and then either "kiss-cutting" or etching gaps or spaces through the metallic layer. In a kiss-cutting process, the metallic layer is cut with a blade or laser without also penetrating or cutting the dielectric layer, and small sections of the metallic layer are removed. This is a relatively expensive process that requires special tooling and processing expertise. In an etching process, an acid or other agent is utilized to selectively remove portions of the metallic layer in order to form gaps or spaces. These conventional manufacturing processes are typically time-consuming, resulting in slower processing line speeds and an overall higher cost. For example, certain conventional discontinuous shield manufacturing processes typically operate at line speeds of approximately fifteen meters per minute. As a result of the relatively slow processing speeds, the discontinuous shields cannot be integrated into cables in an in-line manner.

In another conventional process, slits are cut into a metallic foil layer without removing any of the foil and without cutting the dielectric layer. These slits are cut across the entire foil width in order to form discontinuities. However, there is a possibility that the cut foil edges may contact one another, for example, when the shield structure is bent. There is also a possibility that electrical current may arc across the slits during use.

Accordingly, there is an opportunity for improved methods, techniques, and/or systems for forming or manufacturing discontinuous shield structures. There is additionally an opportunity for improved discontinuous shield manufacturing methods and/or systems that may be carried out in a relatively faster and cost-effective manner. There is also an opportunity for discontinuous shield manufacturing methods and/or systems that may be conducted in-line with a cable assembly process. Further, there is an opportunity for improved discontinuous shield structures that may be incorporated into cables.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items; however, various embodiments may utilize elements and/or components other than those illustrated in the figures. Additionally, the drawings are provided to illustrate example embodiments described herein and are not intended to limit the scope of the disclosure.

DETAILED DESCRIPTION

Figure 1:
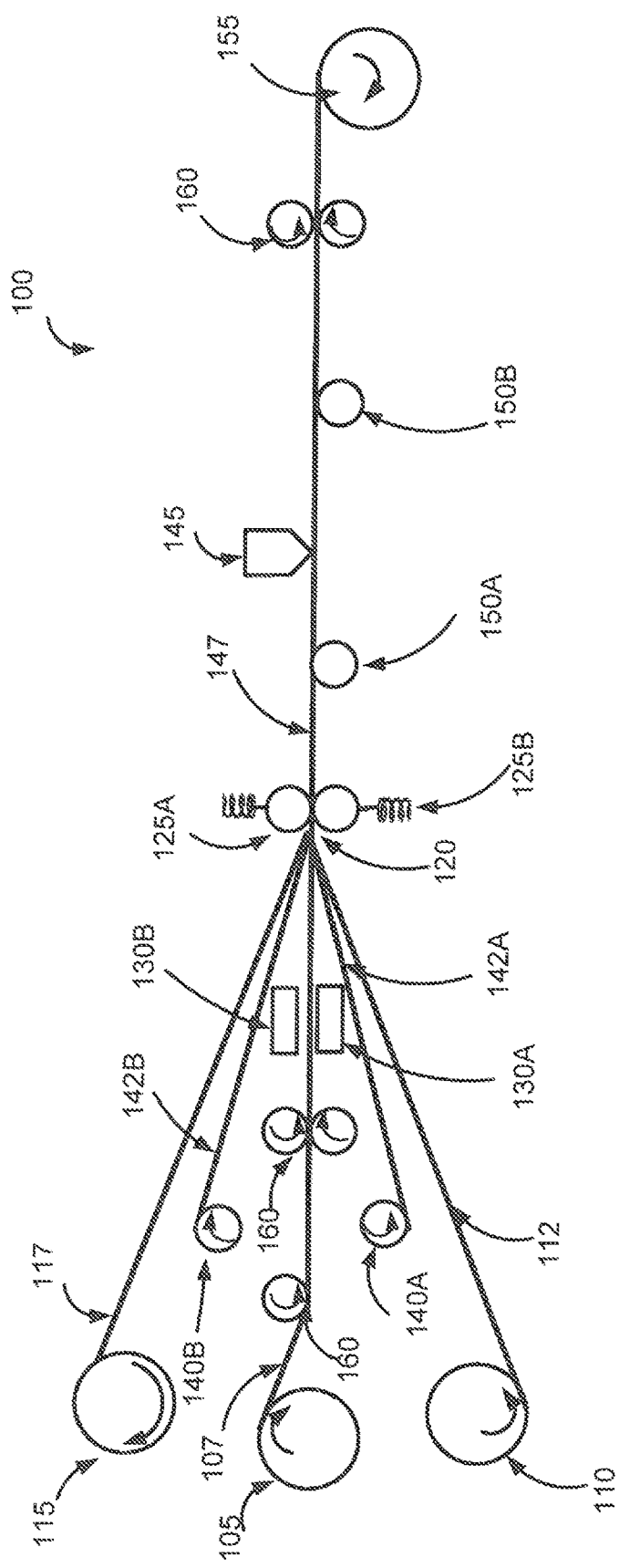
FIGS. 1-4 are block diagrams of example systems that may be utilized to manufacture or form discontinuous shield structures, according to an illustrative embodiment of the disclosure.

Various embodiments of the present disclosure are directed to methods, techniques, and/or systems for manufacturing or otherwise forming discontinuous shield structures for use in conjunction with cables. In certain example embodiments, a base layer of dielectric material may be provided, and a layer of electrically conductive or shielding material may be formed on the base layer. For example, an electrically conductive layer may be adhered to a base layer, deposited on a base layer, or otherwise formed on a base layer. The base layer may extend in a longitudinal direction and may further have a first width. The electrically conductive layer may also extend in the longitudinal direction, and the electrically conductive layer may have a second width that is less than the first width. When formed on the base, layer, the base layer may extend beyond the electrically conductive layer along one or both widthwise edges.

Once an electrically conductive layer has been formed on a base layer, a plurality of longitudinally spaced gaps or holes may be formed through the electrically conductive layer and the base layer. Each gap may have a length that spans across the electrically conductive layer in the width dimension without spanning across the dielectric base layer. In other words, gaps may be formed through the combined base layer and electrically conductive layer structure; however, because the gaps do not span across the entire width of the base layer, the base layer may continuously extend along a longitudinal direction while discontinuities are formed in the electrically conductive layer. In this regard, a discontinuous shield structure may be formed.

A wide variety of suitable methods or techniques may be utilized in order to form gaps or spaces. In certain embodiments, one or more suitable punches, blades, cutting implements, or other suitable cutting means may be utilized to form gaps or spaces. In other embodiments, one or more lasers may be utilized to form gaps or spaces. As desired, gaps or spaces may be formed in a single discontinuous shield structure or concurrently in a plurality of discontinuous shield structures. Additionally, in certain embodiments, a discontinuous shield structure may be incorporated into a cable or formed into a cable component. As a result of forming gaps or spaces through both an electrically conductive layer and a base layer, a discontinuous shield structure may be formed in a relatively faster, more efficient, and/or cost-effective manner than conventional shield structures. For example, a discontinuous shield structure may be formed at line speeds of between approximately ten (10) meters per minute and approximately 100 meters per minute. These increased processing speeds permit overall cost to be reduced. Additionally, these increased speeds permit easier incorporation of shield structures into cables in an in-line process (i.e., without taking up a shield structure between manufacture of the structure and cable assembly).

Other embodiments of the disclosure are directed to discontinuous shield structures that may be incorporated into cables. A discontinuous shield structure may include a base dielectric layer, and an electrically conductive layer may be formed on the base dielectric layer. For example, a metal foil or a metal braid layer may be formed on a base dielectric layer. Both the electrically conductive layer may extend in a longitudinal direction, and the electrically conductive layer may have a width that is less than that of the base dielectric layer. Additionally, gaps or spaces may be formed through both the electrically conductive layer and the base layer at a plurality of respective locations along the longitudinal length or within the longitudinal direction. Each gap may span across the entire width of the electrically conductive layer without spanning across the entire width of the base dielectric layer. In this regard, a plurality of discontinuous patches of electrically conductive material may be defined within the electrically conductive layer. However, the base layer may continuously extend in the longitudinal direction at one or both edges, thereby providing a continuous overall shield structure.

A wide variety of other layers and/or components may be incorporated into a discontinuous shield structure as desired. In certain embodiments, additional layers of dielectric material and/or electrically conductive material may be incorporated. For example, an electrically conductive layer may be sandwiched between two layers of dielectric material. As another example, a discontinuous shield structure may be formed in which the gaps or spaces formed through a first electrically conductive layer and associated dielectric layer are covered by electrically conductive material included in a second discontinuous electrically conductive layer. In yet other embodiments, one or more strength members may be incorporated into a discontinuous shield structure. Indeed, a wide variety of suitable discontinuous shield structures may be formed utilizing the methods and/or techniques described herein, and the structures described below are provided by way of non-limiting example only.

Embodiments of the disclosure now will be described more fully hereinafter with reference to the accompanying drawings, in which certain embodiments of the disclosure are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Example Systems for Forming Discontinuous Shield Structures

FIGS. 1-4 are block diagrams of example systems 100, 200, 300, 400 that may be utilized to manufacture or form discontinuous shield structures, according to an illustrative embodiment of the disclosure. These example systems 100, 200, 300, 400 may be utilized to form a wide variety of suitable discontinuous shield structures, such as the shield structures described in greater detail below with reference to FIGS. 5A-12. Additionally, various components or aspects of any one of the example systems may be substituted into one or more of the other example systems. Indeed, a wide variety of suitable systems and/or combinations of components may be utilized in order to manufacture discontinuous shield structures.

Turning first to FIG. 1, a first example system 100 for manufacturing, constructing, or otherwise forming discontinuous shield structures is illustrated. The system 100 may include a source 105 of electrically conductive material 107 and one or more sources 110, 115 of dielectric material 112, 117. A wide variety of suitable types of electrically conductive material 107 may be provided by source 105, such as a metallic foil material or a metallic braid material. Additionally, a wide variety of suitable types of dielectric material 112, 117 may be provided by sources 110, 115, such as suitable plastic and/or polymeric materials. In certain embodiments, the electrically conductive material 107 and the dielectric materials 112, 117 may be relatively thin, flat materials that extend in a longitudinal direction. These materials may have a wide variety of suitable thicknesses and widths. A few examples of suitable materials are described in greater detail below with reference to the discontinuous shield structures illustrated in FIGS. 5A-12. The sources 105, 110, 115 of material may be, for example, suitable bins or reels of material. In certain embodiments, each source of material may include a suitable payoff from which material may be fed downstream to other components of the system 100.

The electrically conductive material 107 and at least a base layer of dielectric material 112 may be fed through the system 100 to an accumulation point 120 at which they are joined together. In other words, the electrically conductive material 107 may be applied to or formed on a base layer of dielectric material 112. In certain embodiments, one or more suitable devices or components 125A, 125B may apply pressure to the electrically conductive material 107 and the base dielectric material 112 in order to bond or otherwise affix the two layers of material to one another. For example, one or more pressure rollers, spring-mounted rollers, or other suitable components may press the two layers of material together.

According to an aspect of the disclosure, the base layer of dielectric material 112 may have a first width, and the electrically conductive material 107 may have a second width that is less than the first width. When the electrically conductive material 107 is formed on the base layer 112, the base layer 112 may extend beyond the electrically conductive material 107 along one or both edges in a width dimension. In certain embodiments, the electrically conductive material 107 may be approximately centered on the base layer 112 in a width dimension, and the base layer 112 may extend beyond the electrically conductive material 107 along both edges.

The base layer of dielectric material 112 may be positioned on one side of the electrically conductive material 107. As illustrated, the base layer 112 is positioned below or on a bottom side of the electrically conductive material 107; however, in other embodiments, the base layer 112 may be positioned above or on a top side of the electrically conductive material 107. In certain embodiments, an additional layer of dielectric material 117 may be positioned or situated on an opposite side of the electrically conductive material 107. In other words, the electrically conductive material 107 may be sandwiched between two layers 112, 117 of dielectric material. As shown in FIG. 1, an additional "sandwiching" layer of dielectric material 117 may be provided prior to the formation of spaces or gaps. In other embodiments, such as that illustrated in FIG. 2, an additional "sandwiching" layer of dielectric material 117 may be provided following the formation of spaces or gaps.

In certain embodiments, the electrically conductive material 107 may be adhered to the base layer of dielectric material 112 and, if providing, an additional "sandwiching" layer of dielectric material 117. A wide variety of suitable adhesives may be utilized to adhere layers together, such as for example, pressure sensitive adhesives, contact adhesives, hot melt adhesives, heat-sensitive adhesives, etc. In certain embodiments, one or more adhesive application components 130A, 130B may be configured to apply adhesive to the electrically conductive material 107 and/or to one or more layers of dielectric material 112 prior to the layers being brought into contact with one another. For example, one or more application components 130A, 130B may spray, wipe, or otherwise apply adhesive. In other embodiments, one or more layers of material (e.g., the electrically conductive material 107, etc.) may already include applied adhesive that is covered by one or more disposable layers, such as removable paper or film layers, and the one or more adhesive application components 130A, 130B may be configured to remove the disposable layer(s). In yet other embodiments, the electrically conductive material 107 may be bonded to one or more layers of dielectric material 112 using other suitable techniques, such as mechanical fasteners, welding, heated fusion, etc.

As desired in certain embodiments, the electrically conductive material 107 may be sandwiched between two layers of dielectric material 112, 117, and the two layers of dielectric material 112, 117 may be adhered or otherwise bonded together along their edges (i.e., the widthwise edges that extend beyond the electrically conductive material 107). For example, the two layers of dielectric material 112, 117 may be bonded together using one or more suitable adhesives (e.g., pressure sensitive adhesives, etc.), ultrasonic welding, mechanical fasteners, and/or other suitable techniques.

Although the system 100 illustrates the provision of electrically conductive material 107 in the form of a tape layer, electrically conductive material may be provided on a base dielectric layer 112 utilizing a wide variety of other suitable equipment and/or processing techniques. In various example embodiments, electrically conductive material may be painted, printed, sprayed, extruded, or vapor deposited onto a base dielectric layer 112. For example, liquid metal may be painted, sprayed, extruded or otherwise deposited onto a base dielectric layer 112.

In certain embodiments, one or more strength members may additionally be incorporated into a discontinuous shield structure. As shown in FIG. 1, one or more strength member sources 140A, 140B, such as one or more bins or reels that include respective payoffs, may be configured to supply strength members 142A, 142B that are incorporated into a discontinuous shield structure, for example, at the accumulation point 120. A wide variety of suitable types of strength members 142A, 142B may be provided including, but not limited to, aramid fibers, strength yarns, threads, liquid crystal polymer ("LCP") strength members, nylon yarns, nylon strength members, highly-oriented polyethylene fibers, etc. In certain embodiments, each strength member 142A, 142B may be positioned on the base dielectric layer 112 such that it extends in a longitudinal direction parallel to the electrically conductive material 107. In other words, each strength member 142A, 142B may be positioned such that it longitudinally extends along widthwise portion(s) of the base dielectric layer 112 that overhang or extend beyond the electrically conductive material 107. In certain embodiments, a respective strength member 142A, 142B may be positioned on either side of the electrically conductive material 107. Additionally, in certain embodiments, one or more strength members 142A, 142B may be sandwiched between two layers of dielectric material 112, 117. As desired, one or more strength members 142A, 142B may be adhered, glued, mechanically fasted, or otherwise bonded or attached to one or more layers of dielectric material 112, 117. In other embodiments, the strength member(s) 142A, 142B may be held in place by pressure exerted by sandwiching layers of dielectric material 112, 117.

With continued reference to FIG. 1, once the electrically conductive material 107 has been formed on the base dielectric layer 112 (and once one or more optional layers or components have been incorporated), a plurality of longitudinally spaced gaps or holes may be formed through the combined electrically conductive material 107 and base dielectric layer 112 (hereinafter referred to as discontinuous shield structure 147). A wide variety of suitable gap formation tools 145, equipment, and/or means may be utilized as desired. In certain embodiments, one or more suitable punches, punch presses, cutting blades, or other suitable components may be utilized to physically form gaps or holes. In other embodiments, one or more suitable lasers may be utilized to form or cut gaps or holes. Other suitable types of gap formation tools 145 may be utilized in other embodiments provided that the tools are capable of forming holes or openings through the electrically conductive and base dielectric layers.

In certain embodiments, a single gap formation tool 145 may be utilized. As a discontinuous shield structure 147 is fed downstream through the system 100, the gap formation tool 145 may form gaps at different points along the longitudinal length of the discontinuous shield structure 147. In other embodiments, a plurality of gap formation tools 145 may be utilized. In this regard, a plurality of gaps and/or different types of gaps may be formed in a discontinuous shield structure 147. For example, in certain embodiments and explained in greater detail below with reference to FIG. 4, gaps may be formed in a plurality of shield structures in parallel. As another example, gaps may be simultaneously formed at multiple points along a longitudinal length of one or more shield structures. As yet another example, various gap formation tools 145 may form gaps or spaces having different configurations (i.e., different sizes, different angles, etc.). Indeed, a wide variety of different types of tooling and/or equipment configurations may be utilized in order to form desired gaps, holes, or openings.

A gap formation tool 145 may be configured to form gaps having a wide variety of shapes, dimensions, and/or sizes. A gap may be formed with a suitable length that spans across a widthwise dimension of a discontinuous shield structure 147 by an amount that is greater than the width of the electrically conductive layer 107 and less than the width of the dielectric base layer 112. A gap may also be formed at any suitable angle relative to the longitudinal direction of a discontinuous shield structure 147. For example, a gap may be formed at a perpendicular angle relative to the longitudinal direction. In other words, the gap may be formed directly across a width dimension of a discontinuous shield structure 147. As another example, a gap may be formed at any suitable angle such that is extends diagonally across the width dimension of a discontinuous shield structure 147. For example, a gap may be formed at an angle between zero degrees and between ninety degrees relative to the longitudinal direction of the discontinuous shield structure, such as an angle of approximately 5, 10, 15, 20, 25, 30, 35, 40, 45, 50, 55, 60, 65, 70, 75, 80, or 85 degrees, or at any angle included in a range between two of the aforementioned values. In certain embodiments, each of the plurality of gaps formed in a discontinuous shield structure 147 may be formed at approximately the same angle relative to the longitudinal direction. In other embodiments, at least two gaps may be formed at different angles.

Additionally, a gap may be formed with any suitable width or size along a longitudinal direction of a discontinuous shield structure 147. The width or size of a gap may define the isolation spacing between two adjacent patches of electrically conductive material within the discontinuous shield structure 147. Examples of suitable gap widths include, but are not limited to, widths of approximately 0.5, 1.0, 1.5, 2.0, 2.5, 3.0, 3.5, 4, 4.5, or 5 millimeters, widths included in a range between any two of the aforementioned values, or widths included in a range bounded on either a minimum or maximum end by one of the aforementioned values. In certain embodiments, a single gap or space may be formed between adjacent patches of electrically conductive material. In other embodiments, a series of gaps, such as a series of relatively thin microcut gaps having a width of approximately 0.25 mm or less, may be formed in relatively close proximity to one another. These microcuts may permit a discontinuous shield structure 147 to function more like a continuous shield structure; however, when an electrical current is applied to the shield, it may burn up the electrically conductive material between adjacent microcuts, thereby severing electrical continuity and prevent current propagation along a longitudinal length of the discontinuous shield structure 147.

As desired in various embodiments, a wide variety of suitable spacings may exist between gaps (or series of microcut gaps) along a longitudinal direction of a discontinuous shield structure 147. In other words, electrically conductive patches of materials formed between gaps may have any suitable longitudinal lengths. In certain embodiments, the longitudinal length of each patch may be approximately equal. In other embodiments, at least two patches may have varying longitudinal lengths. In the event that patch lengths are varied, the length may vary in accordance with a predetermined pattern or, alternatively, at random.

As desired, the dimensions of the electrically conductive patches can be selected to provide electromagnetic shielding over a specific band of electromagnetic frequencies or above or below a designated frequency threshold. In certain embodiments, each electrically conductive patch may have a longitudinal length of about one meter to about one hundred meters, although lengths of less than one meter (e.g., lengths of about 1.5 to about 2 inches, etc.) may be utilized. For example, the patches may have a length in a range of about one to about ten meters, such as a length between about one and about three meters. In various embodiments, the patches can have a length of approximately 0.5, 0.75, 1.0, 1.5, 2.0, 2.5, 3.0, 3.5, 4.0, 4.5, or 5.0 meters or any length included in a range between any two of these values. In the event that the patches are approximately two meters in length or greater, a return loss spike for a twisted pair cable may be formed within the operating frequency of the cable. However, the amplitude of the return loss spike may satisfy electrical performance requirements for the cable (i.e., fall within acceptable limits), thereby permitting higher signal frequencies to be supported by the cable.

As set forth above, the gap formation tool(s) 145 may be configured to form a wide variety of suitable gap configurations. Additionally, in certain embodiments, the gap formation tool(s) 145 and other components of the system 100 may be configured to operate at line speeds of at least approximately ten (10) meters per minute. For example, the system 100 may operate at line speeds between approximately 10 meters per minute and approximately 100 meters per minute. In various embodiments, the system 100 may operate at a line speed of approximately, 10, 20, 25, 30, 40, 50, 60, 70, 75, 80, 90, or 100 meters per minute, or at a line speed included in a range between two of the above values, or at a line speed included in a range that is bounded on either a minimum or maximum end by one of the above values. In certain embodiments, one or more accumulators 150A, 150B may be incorporated into the system 100. For example, one or more accumulators 150A, 150B may optionally be positioned upstream and/or downstream of the gap formation tool(s) 145. The accumulator(s) 150A, 150B may be configured to temporarily collect the discontinuous shield structure 147 as it is fed downstream through the gap formation tool(s) 145. In this regard, the discontinuous shield structure 147 may be momentarily slowed or stopped in order to more accurately or precisely form each gap.

With continued reference to FIG. 1, once gaps or spaces are formed in the discontinuous shield structure 147, the shield structure 147 may be collected for subsequent use at a suitable take-up device 155, such as a suitable reel or collection bin. In this regard, the discontinuous shield structure 147 may be subsequently provided to a system that assembles a cable or that forms the shield structure 147 into a suitable component for incorporation into a cable. In other embodiments, such as that illustrated in FIG. 2, a discontinuous shield structure 147 may be fed directly into a cable assembly system or process in an in-line or continuous manner. For example, a discontinuous shield structure 147 may be incorporated into a twisted pair communication cable in an in-line manner. In yet other embodiments, the discontinuous shield structure 147 may be formed into a suitable cable component, such as a suitable twisted pair separator prior to being taken up for subsequent incorporation into a cable.

A wide variety of other components and/or devices may be incorporated into the system 100 as desired in various embodiments. For example, any number of rollers and/or dancers, such as the illustrated rollers 160, may be utilized to pull or otherwise advance materials (e.g., electrically conductive material 107, dielectric layers 112, 117, strength members, the discontinuous shield structure 147, etc.) through the system 100. Any number of motors or other drive components may be utilized to power various components of the system 100 and/or to control line speed. As desired, the motors may be collectively or independently controlled by any number of suitable computing and/or control devices. In certain embodiments, the system 100 may additional include one or more printing components or devices that are configure to print alphanumeric characters (e.g., text, a company name, etc.) and/or logos onto a discontinuous shield structure 147. As desired, one or more optical recognition components may be utilized to identify the gaps or spaces in the discontinuous shield structure 147 in order to facilitate printing between the gaps.

Figure 2:
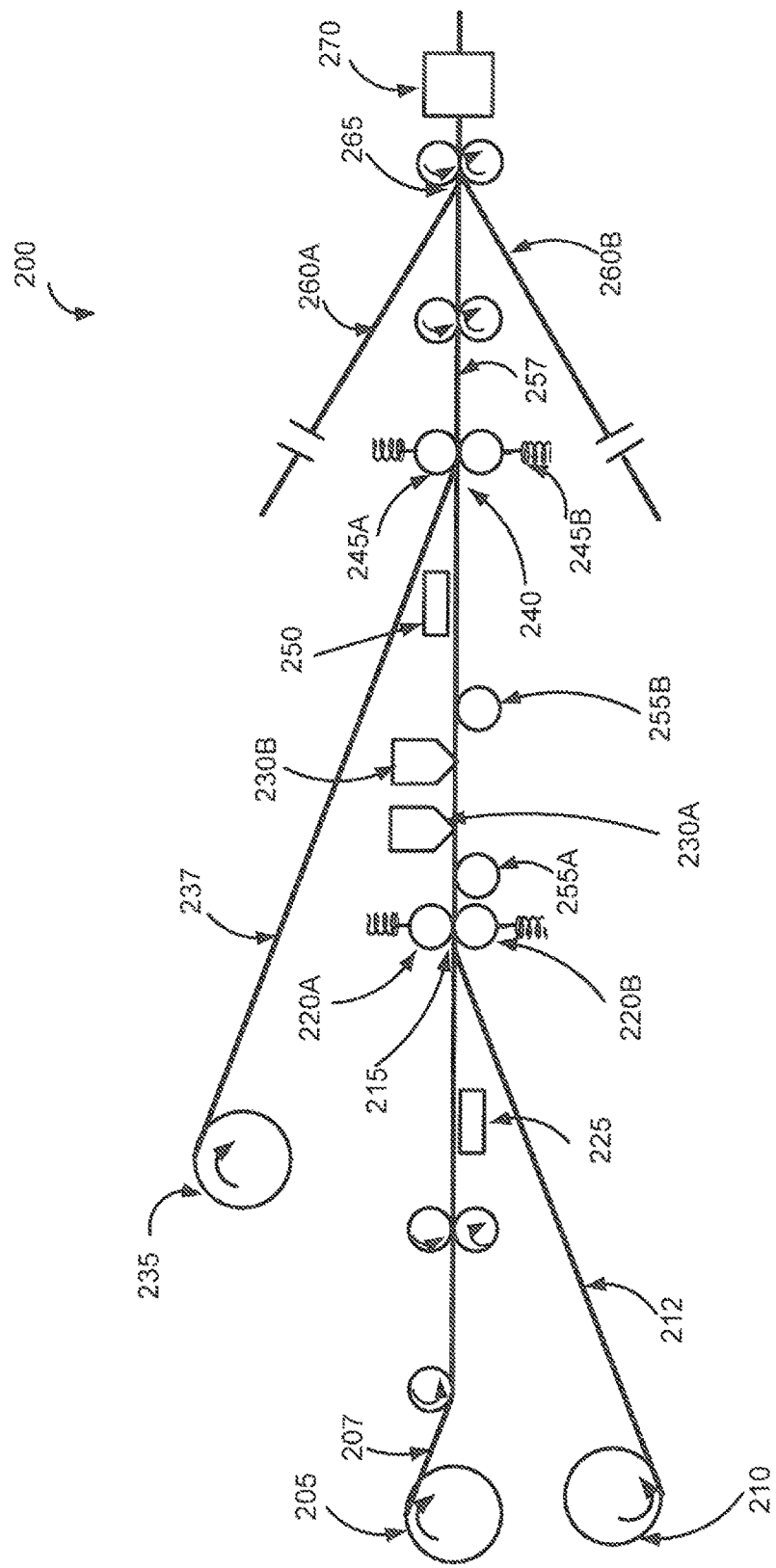

FIG. 2 illustrates another example system 200 that may be utilized to manufacture, construct, or otherwise form discontinuous shield structures. The system 200 may include components that are similar to those described above with reference to the system 100 of FIG. 1. For example, the system 200 may include a source 205 of electrically conductive material 207 and a source 210 of a base dielectric material 212. The electrically conductive material 207 and the base dielectric material 212 may be fed to an accumulation point 215 at which they are joined together. As desired, one or more pressure devices 220A, 220B may press the electrically conductive material 207 and the base dielectric material 212 together. Additionally, one or more suitable devices 225 may apply adhesive or remove a disposable layer prior to the electrically conductive material 207 and the base dielectric material 212 being pressed together. Other components may be added at the accumulation point 215 as desired, such as one or more strength members.

However, in contrast to the system 100 of FIG. 1, the system 200 of FIG. 2 illustrates a single dielectric layer 212 being combined with electrically conductive material 207 at the accumulation point 215. Accordingly, when gaps or spaces are formed via one or more suitable gap formation devices 230A, 230B, the gaps or spaces are only formed through the electrically conductive material 207 and the base dielectric layer 212. A "sandwiching" layer of dielectric material may then be added to the discontinuous shield structure following the formation of gaps or spaces. As a result of the "sandwiching" layer not including gaps, the "sandwiching" layer may provide additional strength or support to the shield structure. An example of such a shield structure is described in greater detail below with reference to FIG. 9.

As shown in FIG. 2, a second source 235 of dielectric material 237 may be provided. The second layer of dielectric material 237 may be fed to a second accumulation point 240 at which it is joined or bonded to the discontinuous shield structure following the formation of gaps through the electrically conductive material 207 and the base dielectric layer 212. As shown, one or more pressure devices 245A, 245B may press the layers of material together when they are combined. Additionally, one or more suitable devices 250 may apply adhesive or remove a disposable layer prior to the layers of material being pressed together. For example, adhesive may be applied to the second layer of dielectric material 237 and/or to the structure formed from the electrically conductive material 207 and the base dielectric layer 212.

With continued reference to FIG. 2, a plurality of longitudinally spaced gap formation tools 230A, 230B are illustrated. As desired, one or more accumulators 255A, 255B may optionally be positioned upstream and/or downstream of the combined gap formation tools 230A, 230B or alternatively, individual gap formation tools or various groupings of gap formation tools. In certain embodiments, the plurality of gap formation tools permits a plurality of gaps or holes to be formed concurrently or relatively close in time. For example, a first gap formation tool 230A may form a gap at a first location along a longitudinal length of shield structure while a second gap formation tool 230B forms a gap at a second location along the longitudinal length. In certain embodiments, the use of a plurality of longitudinally spaced gap formation tools may permit overall line speeds to be increased. Additionally or alternatively, in certain embodiments, such a configuration may permit the formation of gaps or spaces having different dimensions (e.g., different sizes, angles, etc.). For example, a first gap formation tool 230A may be configured to form a gap at a first angle relative to the longitudinal direction of a shield structure while a second gap formation tool 230B may be configured to form a gap at a second angle relative to the longitudinal direction of the shield structure. An example of a shield structure with longitudinally spaced gaps formed at different angles is described in greater detail below with reference to FIGS. 7A-7B. As desired, any number of gap formation tools and configurations may be utilized to form desired gap and electrically conductive patch configurations. In other embodiments, a single gap formation tool, such as a single laser, may be configured to form various gaps having different dimensions.

With continued reference to FIG. 2, following the formation of a discontinuous shield structure (hereinafter referred to as shield structure 257), the shield structure 257 may be incorporated into a cable in an in-line or continuous process. In other words, rather than taking up the shield structure 257 for subsequent use, the shield structure 257 may be fed directly into a cable assembly or cable formation process. As shown, the shield structure 257 may be fed along with any number of other cable components 260A, 260B, such as a plurality of twisted pairs of individually insulated conductors, to an assembly point 265. The shield structure 257 may then be incorporated into the cable prior to the formation of an outer jacket. As shown, the shield structure 257 may be passed through one or more dies 270 that are configured to wrap or fold the shield structure 257 about one or more cable components 260A, 260B. In this regard, a shield layer (e.g., an overall shield layer, an individual shield layer, etc.) may be formed around one or more twisted pairs of conductors. In other embodiments, the shield structure 257 may be passed through one or more dies (or other components) configured to form the shield structure 257 into a separator that may be positioned between two or more twisted pairs of conductors. Other suitable components and/or devices may be utilized to incorporate the shield structure 257 into a cable. The illustrated components are provided by way of example only.

As desired, one or more components of the system 200 may be synchronized with one or more components of a cable assembly system. For example, a line speed of a system 200 that assembles or manufactures a discontinuous shield structure may controlled such that it is approximately equal to the line speed of a system 200 that assembles cable. In this regard, a discontinuous shield structure may be manufactured and fed into a cable assembly process in a continuous manner. The systems and methods described herein for manufacturing discontinuous shield structures permit line speeds that are greater than those of conventional processes. These increased line speeds may facilitate the synchronization of a discontinuous shield structure manufacturing process and a cable assembly process.

Figure 3:
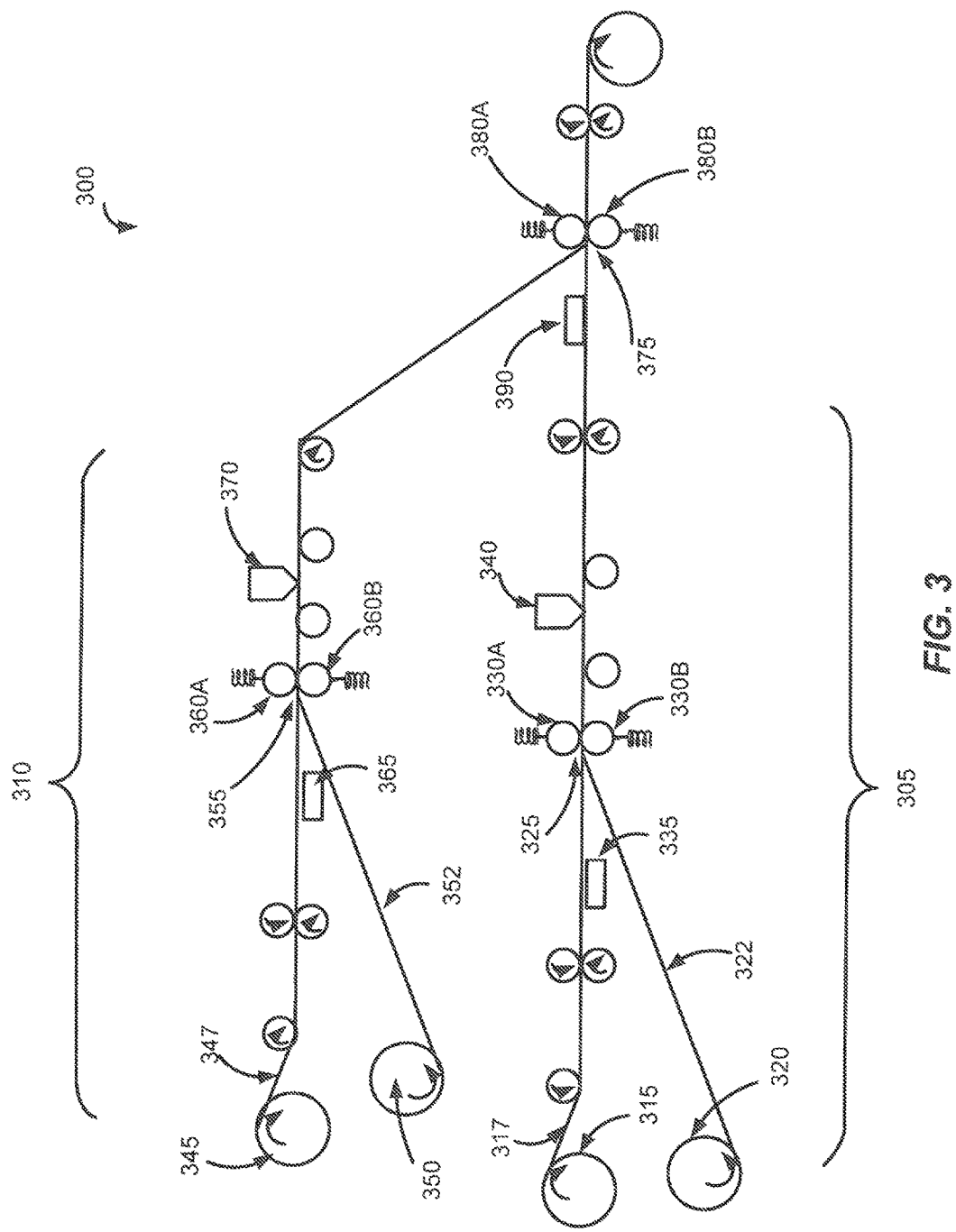

Turning now to FIG. 3, another example system 300 that may be utilized to manufacture, construct, or otherwise form discontinuous shield structures is illustrated. The system 300 may include components that are similar to those described above with reference to the systems 100, 200 of FIGS. 1-2. However, in the system 300 of FIG. 3, a plurality of separate discontinuous shield structures may be produced in parallel and then combined together in order to form a final structure. For example, two separate discontinuous shield structures that each include electrically conductive material formed on a base dielectric layer may be formed. The two structures may then be bonded together. As desired, the respective gaps or holes in each shield structure may be longitudinally offset from one another. In this regard, a final shield structure may be formed in which the gaps or holes formed through a first electrically conductive layer are covered by electrically conductive material included in a second electrically conductive layer. An example of such a shield structure is described in greater detail below with reference to FIGS. 11A-B.

With reference to FIG. 3, the system 300 may include a first subsystem 305 configured to produce a first shield structure and a second subsystem 310 configured to produce a second shield structure. The first subsystem 305 may include a source 315 of electrically conductive material 317 and a source 320 of a base dielectric material 322. The electrically conductive material 317 and the base dielectric material 322 may be fed to an accumulation point 325 at which they are joined together. As desired, one or more pressure devices 330A, 330B may press the electrically conductive material 317 and the base dielectric material 322 together. Additionally, one or more suitable devices 335 may apply adhesive or remove a disposable layer prior to the electrically conductive material 317 and the base dielectric material 322 being pressed together. Other components may be added at the accumulation point 325 as desired, such as one or more strength members. Longitudinally spaced gaps or holes may then be formed in the combined electrically conductive material 317 and base dielectric material 322 by one or more gap formation tools 340.

Similarly, the second subsystem 310 may include a source 345 of electrically conductive material 347 and a source 350 of a base dielectric material 355. The electrically conductive material 347 and the base dielectric material 352 may be fed to an accumulation point 355 at which they are joined together. As desired, one or more pressure devices 360A, 360B may press the electrically conductive material 347 and the base dielectric material 352 together. Additionally, one or more suitable devices 365 may apply adhesive or remove a disposable layer prior to the electrically conductive material 347 and the base dielectric material 352 being pressed together. Other components may be added at the accumulation point 355 as desired, such as one or more strength members. Longitudinally spaced gaps or holes may then be formed in the combined electrically conductive material 347 and base dielectric material 352 by one or more gap formation tools 370.

The outputs of the first subsystem 305 and the second subsystem 310 may be fed downstream to an accumulation point 375 at which they are joined together. In this regard, an overall discontinuous shield structure may be formed that includes a plurality of dielectric layers and a plurality of layers of electrically conductive material. As desired, one or more pressure devices 380A, 380B may press the two substructures together. Additionally, one or more suitable devices 355 may apply adhesive or remove a disposable layer prior to the two substructures being pressed together. Alternatively, the two substructures may be bonded together utilizing other suitable components and/or techniques, such as mechanical fasteners or ultrasonic welding. Additionally, other components may be added at the accumulation point 375 as desired, such as one or more strength members. Following formation of the overall discontinuous shield structure, the structure may be taken up for subsequent incorporation into a cable as illustrated in FIG. 3. Alternatively, in other embodiments, the overall shield structure may be incorporated into a cable in an in-line process or formed into a suitable cable component, such as a separator component.

In certain embodiments, the gaps or holes formed in a first substructure may be longitudinally offset from the gaps or holes formed in a second substructure when the overall shield structure is formed. In other words, electrically conductive material included in the second substructure may cover any gaps or spaces formed through the electrically conductive material of the second substructure. In this regard, an overall discontinuous shield structure may be formed that functions much like a continuous shield with respect to electromagnetic shielding. In the event that electrical signals leak through one of the substructures, the other substructure may perform a shielding function. The presence of multiple layers of electrically conductive material may further provide enhanced shielding relative to shields with a single layer of electrically conductive material. In certain embodiments, multiple layers of electrically conductive material may also contribute to improved cable burn performance. Although the system 300 of FIG. 3 illustrates the formation of a shield structure that includes two dielectric layers and two electrically conductive layers, any number of layers may be incorporated into a shield structure as desired in various embodiments.

Figure 4:
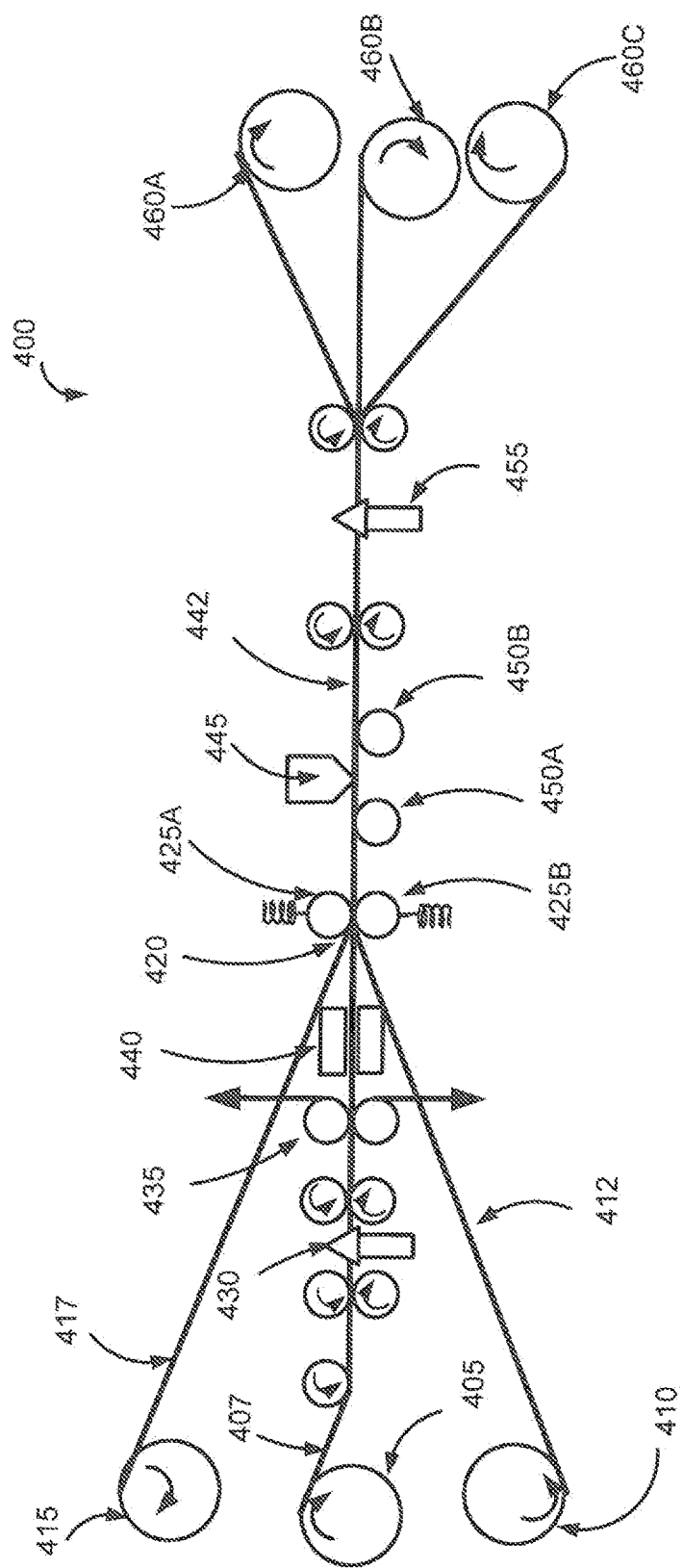

FIG. 4 illustrates another example system 400 that may be utilized to manufacture, construct, or otherwise form discontinuous shield structures. The system 400 may include components that are similar to those described above with reference to the systems 100, 200, 300 of FIGS. 1-3. However, in the system 400 of FIG. 4, a plurality of discontinuous shield structures may be manufactured in parallel utilizing shared dielectric material that is subsequently cut or slit into individual shield structures.

The system 400 may include a source 405 of electrically conductive material 407 and one or more sources of dielectric material, such as a source 410 of a base dielectric material 412 and an optional source 415 of a "sandwiching" layer of dielectric material 417. The electrically conductive material 407 and the layer(s) 412, 417 of dielectric material may be fed to an accumulation point 420 at which they are joined together. As desired, one or more pressure devices 4250A, 425B may press the electrically conductive material 407 and the layer(s) 412, 417 of dielectric material together.

In contrast to the systems 100, 200, 300 of FIGS. 1-3, the electrically conductive material 407 may be cut or slit in the system 400 of FIG. 4 prior to being fed to the accumulation point 420. In other words, a single source or layer of electrically conductive material 407 may be cut into a plurality of longitudinally extending strips that may be joined to or otherwise formed on the based dielectric layer 412. An example of a base dielectric layer 412 on which a plurality of longitudinally extending strips of electrically conductive material have been formed in described in greater detail below with reference to FIG. 12. According to an aspect of the disclosure, each of the strips of electrically conductive material 407 may extend along a longitudinal length of the base dielectric layer 412 in parallel to one another. Additionally, adjacent strips of electrically conductive material 407 may be spaced apart from one another along a widthwise dimension of the base dielectric layer 412. The spacing may permit respective gaps or holes to be formed through each of the strips of electrically conductive material 407. Additionally, the spacing may facilitate subsequent slitting of the base dielectric layer 412 in order to form a plurality of individual discontinuous shield structures following the formation of gaps or holes.

With reference to FIG. 4, one or more cutting or slitting tools 430 may be configured to slit or cut the electrically conductive material 407 into a plurality of longitudinally extending strips. Examples of suitable cutting tools 430 include, but are not limited to, blades, knives, or other cutting implements configured to form a longitudinally extending cut through the electrically conductive material. Additionally, in certain embodiments, one or more scrap removal devices 435, such as scrap removal rollers and/or a vacuum system, may be configured to remove scrap electrically conductive material (e.g., scraps formed during cutting or slitting) and/or other debris prior to the strips of electrically conductive material 407 being formed on the base dielectric material 412. Additionally, one or more suitable devices 440 may apply adhesive or remove a disposable layer prior to the electrically conductive material 407 and the base dielectric material 412 being pressed together. Other components may be added at the accumulation point 420 as desired, such as one or more strength members.

As an alternative to cutting or slitting the electrically conductive material 407, in other embodiments, a plurality of sources of electrically conductive material may be provided. Each source may provide electrically conductive material that is fed to the accumulation point to be joined with the base dielectric layer. In yet other embodiments, other suitable techniques may be utilized to form a plurality of longitudinally extending parallel layers of electrically conductive material on a base dielectric layer. For example, a plurality of electrically conductive layers may be formed in parallel utilizing electrically conductive paint, extrusion, or vapor deposition.

As desired in various embodiments, any number of strips of electrically conductive material may be formed or otherwise provided. For example, between approximately two and approximately ten strips of electrically conductive material may be formed. In various embodiments, approximately 2, 3, 4, 5, 6, 7, 8, 9, 10, or any number of strips included in a range between two of the previous values may be provided. In the example system 400 illustrated in FIG. 4, three strips of electrically conductive material are formed. As desired in various embodiments, each strip may be formed with any suitable width. In certain embodiments, the width may be determined based at least in part on the desired application of a discontinuous shielding structure. For example, if a shield structure is utilized to form a shield one or more transmission media, the width may correspond to a desired circumference of the shield layer to be formed. Additionally, in certain embodiments, each strip may be formed with widths that are approximately equal. In other embodiments, at least two strips may be formed with different widths. For example, a first strip may be incorporated into a shield structure that is utilized for an individual twisted pair shield while a second wider strip is incorporated into a shield structure that is utilized for a shield formed around a plurality of twisted pairs (e.g., an overall shield). Indeed, a wide variety of suitable configurations of strips and/or strip dimensions may be utilized.

With continued reference to FIG. 4, once the plurality of strips of electrically conductive material are formed on the base dielectric layer 412 or, in certain embodiments, between two layers 412, 417 of dielectric material, the combined structure (hereinafter referred to as discontinuous shield structure 442) may be fed to one or more gap formation tools 445. The gap formation tool(s) 445 may be configured to form longitudinally spaced gaps or holes in the discontinuous shield structure 442. Respective gaps or holes may be formed through each of the strips of electrically conductive material and any dielectric layers included in the shield structure 442. In certain embodiments, a single gap formation tool 445 may be utilized to form respective gaps or spaces associated with each strip of electrically conductive material. For example, a single punch or other suitable device may form gaps through each electrically conductive strip. As desired, the single punch may include a plurality of punching prongs that are spaced from each other in a widthwise dimension in order to form a plurality of gaps that are spaced in the widthwise dimension and each associated with a respective electrically conductive strip. In other embodiments, a plurality of gap formation tools 445, such as a respective tool or group of tools associated with each electrically conductive strip, may be utilized. Indeed, a wide variety of different types and configurations of tooling may be utilized as desired in various embodiments. Additionally, as desired, any number of accumulators 450A, 450B may be utilized in order to momentarily stop or otherwise control the line speed of the shield structure 442 to facilitate formation of gaps or holes.

Following the formation of gaps or holes in the discontinuous shield structure 442, the shield structure 442 may be fed to one or more suitable cutting or slitting devices 455 configured to cut the shield structure 442 into a plurality of separate structures. In certain embodiments, the shield structure 442 may be cut along its longitudinal length between the parallel strips of electrically conductive material. In other words, the base dielectric layer 412 of the shield structure 442 may be slit along one or more longitudinally extending lines that are situated between strips of electrically conductive material. In this regard, a plurality of individual discontinuous shield structures may be manufactured concurrently and then separated from one another after the formation of gaps or holes (and, in certain embodiments, after the incorporation of other elements, such as a "sandwiching" layer added after the formation of gaps). As shown in FIG. 4, once the shield structure 442 has been slit, each of the individual shield structures may be provided to respective take-ups 460A, 460B, 460C for subsequent use. In other embodiments, one or more of the individual shield structures may be incorporated into a cable in an in-line or continuous manner, as described above with reference to FIG. 2. In yet other embodiments, one or more of the individual shield structures may be formed into a cable component for subsequent incorporation into a cable.

The systems 100, 200, 300, 400 described above with reference to FIGS. 1-4 are provided by way of example only. As desired, more or less components may be incorporated into any of the systems. Additionally, various systems may include any suitable combinations of components that are taken from any number of the systems 100, 200, 300, 400 described in order to produce desired discontinuous shield structures. The described system are only intended to discuss various types of discontinuous shield structures and associated features for these structures.

Example Discontinuous Shield Structures

According to an aspect of the disclosure, discontinuous shield structures may be formed that include longitudinally spaced gaps or spaces through both a layer of electrically conductive material and a base layer of dielectric material. A wide variety of different types of discontinuous shield structures may be manufactured or formed as desired. For example, different types of discontinuous shield structures may be formed by each of the systems 100, 200, 300, 400 described above with reference to FIGS. 1-4. A few example structures will now be described with reference to FIGS. 5A-12, which illustrate top level and cross-sectional views of example discontinuous shield structures that may be incorporated into cables.

Figure 5A:
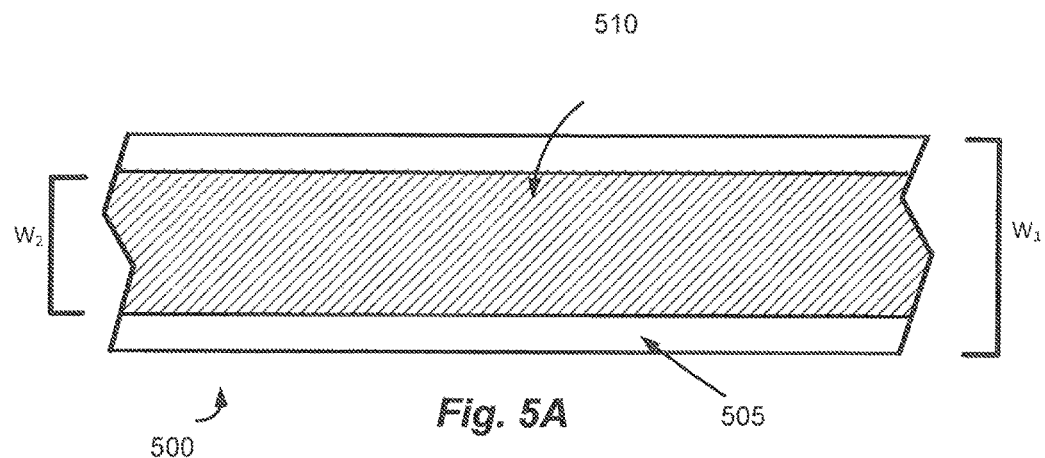
FIGS. 5A-12 are top level and cross-sectional views of example discontinuous shield structures that may be incorporated into cables, according to example illustrative embodiments of the disclosure.
Figure 5B:
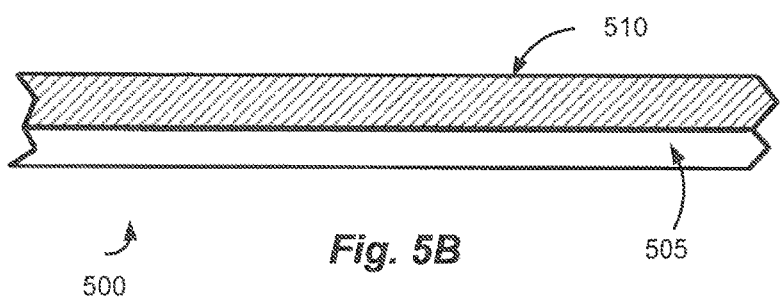

FIGS. 5A and 5B respectively illustrate a top level and a cross-sectional view of a discontinuous shield structure 500 in which a layer of electrically conductive material 510 has been formed on a base dielectric layer 505. However, gaps or spaces have not yet been formed through the electrically conductive material 510 and the dielectric layer 505. As shown, both the electrically conductive material 510 and the dielectric layer 505 may extend along a longitudinally direction. Additionally, each layer of material may have a respective width along a width dimension that is perpendicular to the longitudinal direction. For example, the base dielectric layer 505 may have a first width "$W_1$", and the electrically conductive material 510 may have a second width "$W_2$" that is less than the first width. Accordingly, when the electrically conductive material 510 is formed on the dielectric layer 505, the dielectric layer 505 may extend beyond the electrically conductive material 510 along one or both widthwise edges. As shown, the dielectric layer 505 extends beyond the electrically conductive material 510 along both widthwise edges. For example, the electrically conductive material 510 may be approximately centered on the dielectric layer 505 along the width dimension (i.e., each layer may have a common center line along the width dimension). As a result, when gaps or spaces are formed, the overhanding or extending portions of the dielectric layer 505 may provide support and longitudinal continuity to the shield structure 500.

As desired, the base dielectric layer 505 may be formed from or formed substantially from one or more dielectric materials. A wide variety of suitable dielectric materials may be utilized including, but not limited to, paper, various plastics, one or more polymeric materials, one or more polyolefins (e.g., polyethylene, polypropylene, etc.), one or more fluoropolymers (e.g., fluorinated ethylene propylene ("FEP"), melt processable fluoropolymers, MFA, PFA, polytetrafluoroethylene, ethylene tetrafluoroethylene ("ETFE"), ethylene chlorotrifluoroethylene ("ECTFE"), etc.), one or more polyesters, polyimide, polyvinyl chloride ("PVC"), one or more flame retardant olefins (e.g., flame retardant polyethylene ("FRPE"), flame retardant polypropylene ("FRPP"), a low smoke zero halogen ("LSZH") material, etc.), polyurethane, neoprene, cholorosulphonated polyethylene, flame retardant PVC, low temperature oil resistant PVC, flame retardant polyurethane, flexible PVC, or any other suitable material or combination of materials. As desired, one or more foamed materials may be utilized to form the first portion. Indeed, the first portion may be filled, unfilled, foamed, un-foamed, homogeneous, or inhomogeneous and may or may not include one or more additives (e.g., flame retardant and/or smoke suppressant materials).

The base dielectric layer 505 may also be formed with a wide variety of suitable dimensions. For example, the base dielectric layer 505 may have any suitable width "$W_1$". In certain embodiments, the width "$W_1$" may be determined based at least in part upon a desired cable component (e.g., a shield, a separator, etc.) to be formed from a shield structure. In other embodiments, the width "$W_1$" may be determined based at least in part upon a desired number of shield structures to be formed utilizing a single base dielectric layer 505. In certain example embodiments, the base dielectric layer 505 may have a width "$W_1$" between approximately five (5) mm and approximately thirty (30) mm. For example, the base dielectric layer 505 may have a width of approximately 5, 10, 15, 20, 25, or 30 mm, a width included in a range between two of the above values, or a width included in a range that is bounded at either a minimum or maximum end by one of the above values. Additionally, the base dielectric layer 505 may be formed with any suitable thickness. For example, the base dielectric layer 505 may have a thickness between approximately 10 micrometers (μm) and approximately 75 μm.

Additionally, the electrically conductive material 510 may be formed with a wide variety of suitable constructions and/or dimensions. For example, the electrically conductive material 510 may have any suitable width "$W_2$". In certain embodiments, the width "$W_2$" may be determined based at least in part upon a desired cable component (e.g., a shield, a separator, etc.) to be formed from a shield structure. In certain example embodiments, the electrically conductive material 510 may have a width "$W_2$" between approximately 3 mm and approximately 25 mm. For example, the electrically conductive material 510 may have a width of approximately 3, 5, 10, 12, 15, 18, 20, 22, or 25 mm, a width included in a range between two of the above values, or a width included in a range that is bounded at either a minimum or maximum end by one of the above values. Additionally, the electrically conductive material 510 may be formed with any suitable thickness. For example, the electrically conductive material 510 may have a thickness between approximately 0.5 mils (12.7 microns) and approximately 3.0 mils (76.2 microns), such as a thickness between approximately 1.0 mils (25.4 microns) and approximately 3.0 mils. In some applications, cable signal performance may benefit from a thickness that is greater than about 2 mils, for example in a range of about 2.0 to about 2.5 mils, about 2.0 to about 2.25 mils, about 2.25 to about 2.5 mils, about 2.5 to about 3.0 mils, or about 2.0 to about 3.0 mils. A greater thickness may limit negative insertion loss characteristics.

The electrically conductive material 510 may also be from a wide variety of suitable materials and/or combinations of materials. Examples of suitable electrically conductive materials that include, but are not limited to, metallic materials (e.g., silver, copper, nickel, steel, iron, annealed copper, gold, aluminum, etc.), metallic alloys, conductive composite materials, etc. Indeed, suitable electrically conductive materials may include any material having an electrical resistivity of less than approximately $1 \times 10^{-7}$ ohm meters at approximately 20° C. In certain embodiments, an electrically conductive material may have an electrical resistivity of less than approximately $3 \times 10^{-8}$ ohm meters at approximately 20° C. In certain embodiments, the electrically conductive material 510 may be formed as a foil layer, such as a metallic foil layer. In other embodiments, the electrically conductive material 510 may be formed as a metallic screen. In yet other embodiments, electrically conductive material 510 may be extruded, sprayed, or otherwise deposited on the base dielectric layer 505.

Figure 5C:
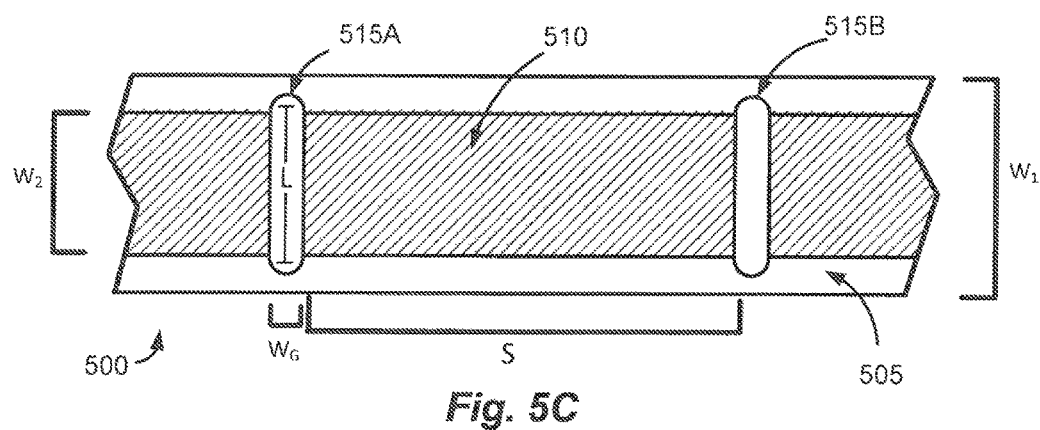
Figure 5D:
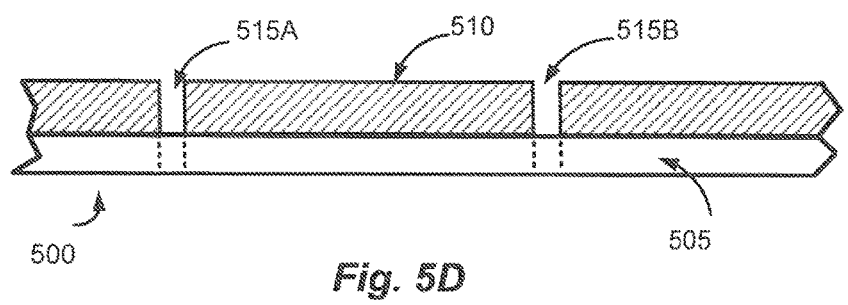

FIGS. 5C and 5D respectively illustrate the discontinuous shield structure 500 following the formation of longitudinally spaced gaps or holes 515A, 515B through the electrically conductive material 510 and the base dielectric layer 505. Each gap 515A, 515B may have a length "L" that extends across the width dimension of the shield structure 500. According to an aspect of the disclosure, the length "L" may extend across the width dimension by an amount that is greater than the width "$W_2$" of the electrically conductive material 510 but less than the width "$W_1$" of the base dielectric layer 505. As shown, in certain embodiments, gaps may be formed at an angle that is perpendicular to the longitudinal direction. In other embodiments, such as those discussed below with reference to FIGS. 6A-7B, gaps may be formed at other angles. Each gap 515A, 515B may also be formed with any suitable width "$W_G$", which defines the spacing between adjacent electrically conductive patches. A few example gap widths are described in greater detail above with reference to FIG. 1.

Additionally, as described in greater detail above with reference to FIG. 1, a wide variety of suitable distances may be present between gaps along a longitudinal direction of the shield structure 500. For example, any suitable spacing "S" may be present between the gaps 515A, 515B illustrated in FIGS. 5C and 5D. The spacing may define the sizes of electrically conductive patches of material included in the discontinuous shield structure 500.

Figure 6A:
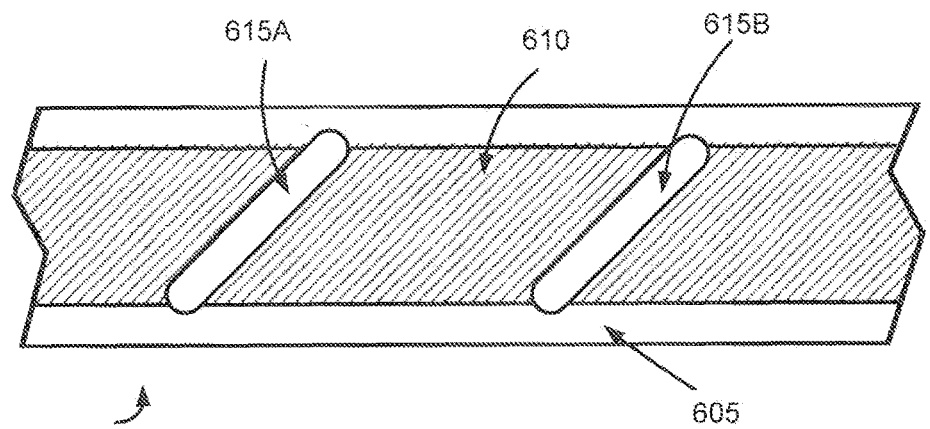
Figure 6B:
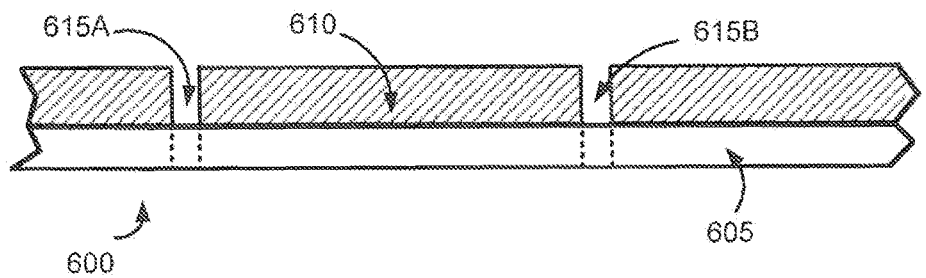

FIGS. 6A and 6B respectively illustrate top level and cross-sectional views of a discontinuous shield structure 600 in which gaps or holes are formed at an angle that is not perpendicular to the longitudinal direction of the structure 600. The shield structure 600 may include a base dielectric layer 605, and electrically conductive material 610 may be formed on the base dielectric layer 605. Additionally, longitudinally spaced gaps or holes 615A, 615B may be formed through both the electrically conductive material 610 and the dielectric layer 605. As shown, the gaps 615A, 615B are formed at an acute angle relative to the longitudinal direction. As desired, gaps 615A, 615B may be formed at any suitable angle, such as an angle of approximately 5, 10, 15, 20, 25, 30, 35, 40, 45, 50, 55, 60, 65, 70, 75, 80, or 85 degrees, or at any angle included in a range between two of the aforementioned values. In certain embodiments, the acute angle may enhance electrically conductive patch-to-substrate adhesion. Additionally, the acute angle may facilitate the covering of opposing isolating spaces or gaps when a cable component, such as a shield layer, is formed from the structure 600. In certain embodiments, benefit may be achieved when the acute angle is about 45 degrees or less. In other embodiments, benefit may be achieved when the acute angle is about 35 degrees or less, about 30 degrees or less, about 25 degrees or less, about 20 degrees or less, or about 15 degrees or less. In other embodiments, benefit may be achieved when the acute angle is between about 12 and 40 degrees. Regardless of the angle at which a gap is formed, the gap may have a suitable length such that it spans across a widthwise dimension of the shield element 600 by an amount greater than the width of the electrically conductive material 610 but less than the width of the base dielectric material 605.

Figure 7A:
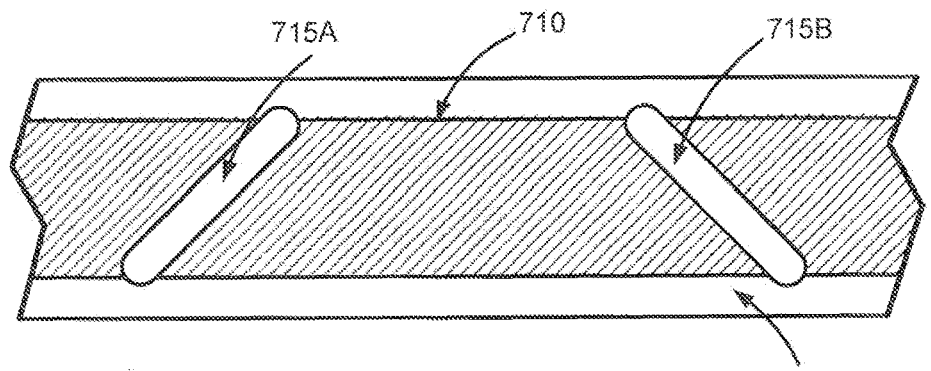
Figure 7B:
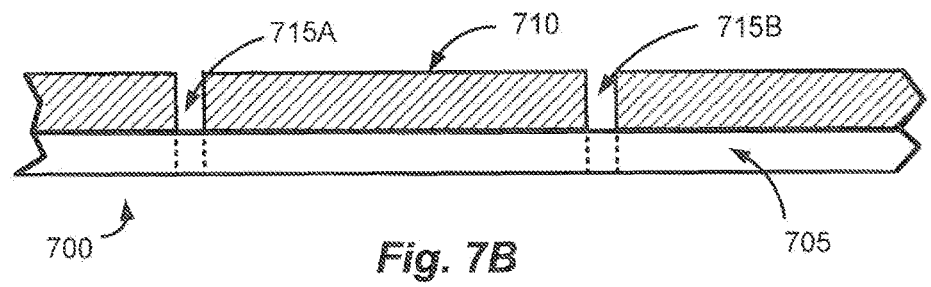

FIGS. 7A and 7B respectively illustrate top level and cross-sectional views of another discontinuous shield structure 700 in which gaps or holes are formed at angles that are not perpendicular to the longitudinal direction of the structure 700. The shield structure 700 may include a base dielectric layer 705, and electrically conductive material 710 may be formed on the base dielectric layer 705. Additionally, longitudinally spaced gaps or holes 715A, 715B may be formed through both the electrically conductive material 710 and the dielectric layer 705. As shown, at least two gaps 715A, 715B are formed at different angles relative to the longitudinal direction. For example, a plurality of gap formation tools may be utilized to form gaps at different angles. As set forth above, each gap may be formed at any suitable angle relative to the longitudinal direction of the shield structure. However, as shown, a portion of the gaps may be formed in a first direction while another portion of the gaps is formed in a second direction.

Additionally, in certain embodiments, the gaps may be formed with a suitable pattern or in accordance with a repeating step. As a result, the shield structure 700 may include electrically conductive patches having a trapezoidal shape. In certain embodiments, the orientation of adjacent trapezoidal patches may alternate. Similar to the shield structure illustrated in FIGS. 6A and 6B, the trapezoidal patches may provide layer adhesion and/or shielding benefits. A wide variety of other suitable patch configurations may be utilized as desired in various embodiments.

Figure 8A:
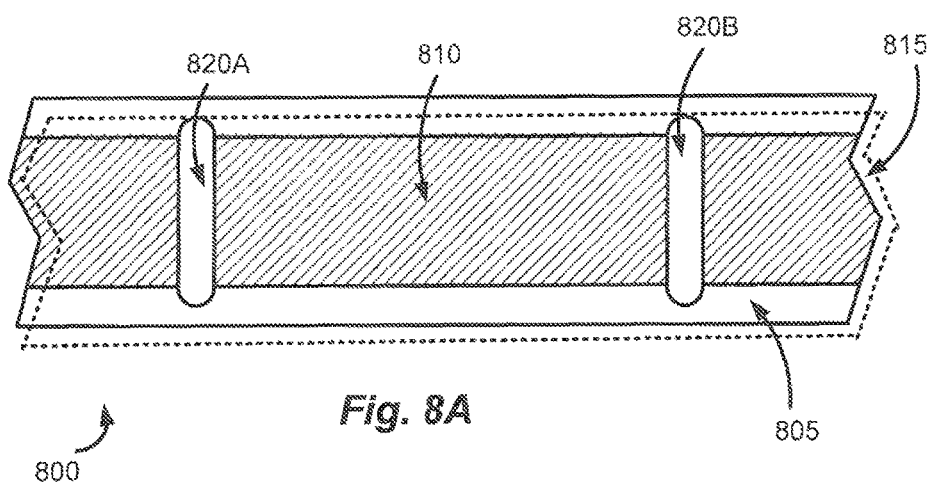
Figure 8B:
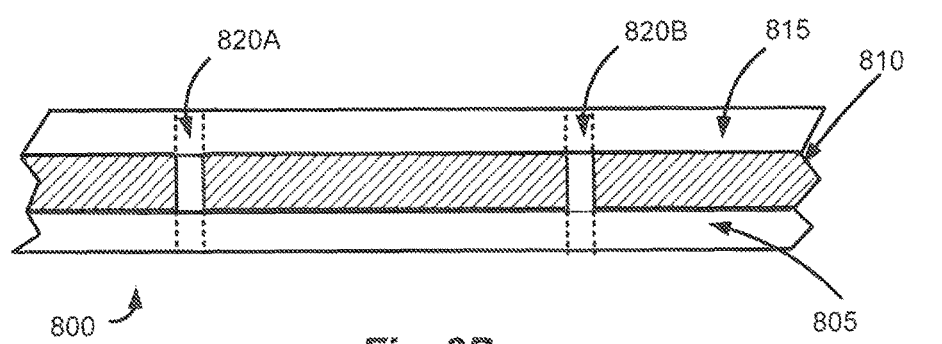

In certain embodiments, discontinuous shield structures may be formed in which electrically conductive material is sandwiched between two layers of dielectric material. FIGS. 8A and 8B respectively illustrate a top view and a cross-sectional view of an example shield structure 800 in which electrically conductive material 810 is positioned between two layers of dielectric material 805, 815. For example, electrically conductive material 810 may be formed on a base layer of dielectric material 805, and a second layer of dielectric material 815 may be positioned on an opposite side or surface of the electrically conductive material 810. Additionally, as shown in FIGS. 8A and 8B, a plurality of longitudinally spaced gaps or holes, such as gaps 820A and 820B, may be formed through the electrically conductive material 810 and the dielectric layers 805, 815.

Figure 9:
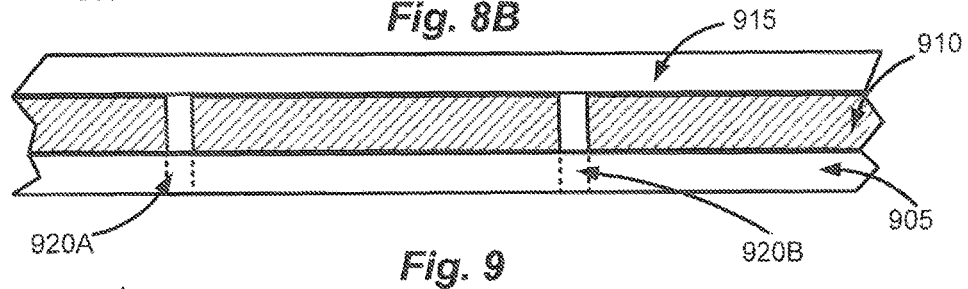

During the formation of the shield structure 800 illustrated in FIGS. 8A and 8B, the second layer or sandwiching layer of dielectric material may be added to the structure 800 prior to the formation of gaps or holes. In other example shield structures, such as the shield structure 900 illustrated in FIG. 9, gaps or holes may be formed prior to the addition of a sandwiching layer of dielectric material. FIG. 9 illustrates a cross-sectional view of an example shield structure 900 in which electrically conductive material 910 is formed on a base dielectric layer 905. Longitudinally spaced gaps or holes, such as gaps 920A and 920B, may then be formed through the electrically conductive material 910 and the base dielectric layer 905. Following the formation of the gaps or holes, a sandwiching layer of dielectric material 915 may be joined to the electrically conductive material 910 and/or the base dielectric layer 905.

Figure 10:
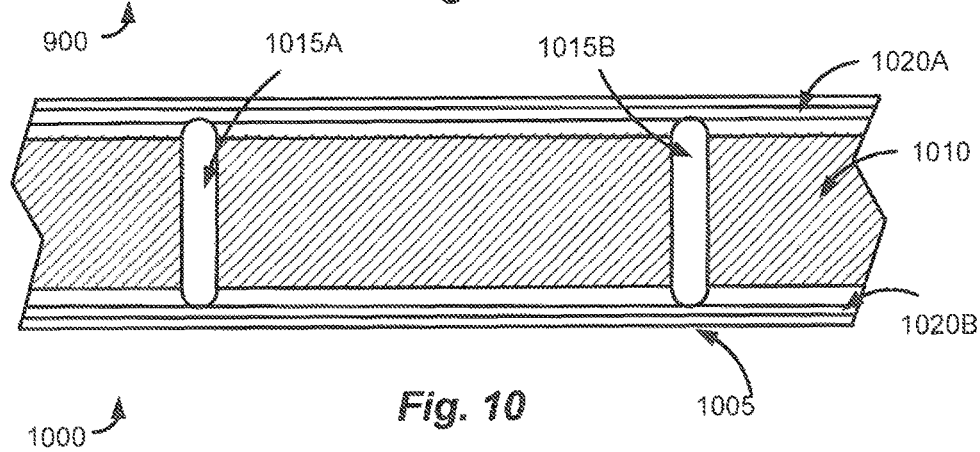

In certain embodiments, one or more strength members may be incorporated into a discontinuous shield structure. FIG. 10 illustrates a top level view of an example discontinuous shield structure 1000 that includes strength members, such as strength yarns. The shield structure 1000 may include at least a base layer of dielectric material 1005, and electrically conductive material 1010 may be formed on the base dielectric layer 1005. As desired, an optional sandwiching dielectric layer may also be provided. A plurality of longitudinally spaced gaps or holes, such as gaps 1015A and 1015B, may be formed through at least the electrically conductive material 1010 and the base dielectric layer 1005. Additionally, the base dielectric layer 1005 may have a width that is greater than that of the electrically conductive material 1010 such that the base dielectric layer 1005 extends beyond the electrically conductive material 1010 along one or both widthwise edge. One or more longitudinally extending strength members, such as strength members 1020A and 1020B, may be positioned within the overhanging regions of the base dielectric layer 1005. As illustrated, the base dielectric layer 1005 may extend beyond the electrically conductive material along both widthwise edges, and a respective strength member 1020A, 1020B may be positioned within each overhanging region. In other words, the strength members 1020A, 1020B may be positioned such that gaps or holes 1015A, 1015B are not formed through the strength members 1020A, 1020B or positioned over or under the strength members 1020A, 1020B. The strength members 1020A, 1020B may extend along the longitudinal direction of the structure 1000 parallel to the electrically conductive material 1010. Additionally, the strength members 1020A, 1020B may provide structural support to the discontinuous shield structure 1000.

Figure 11A:
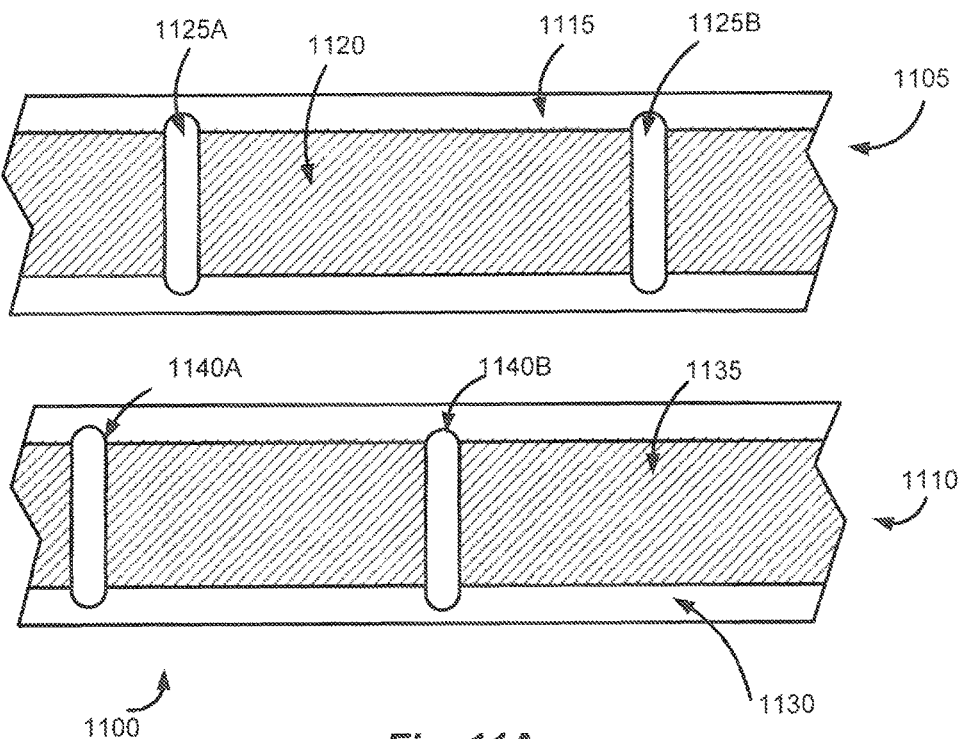
Figure 11B:
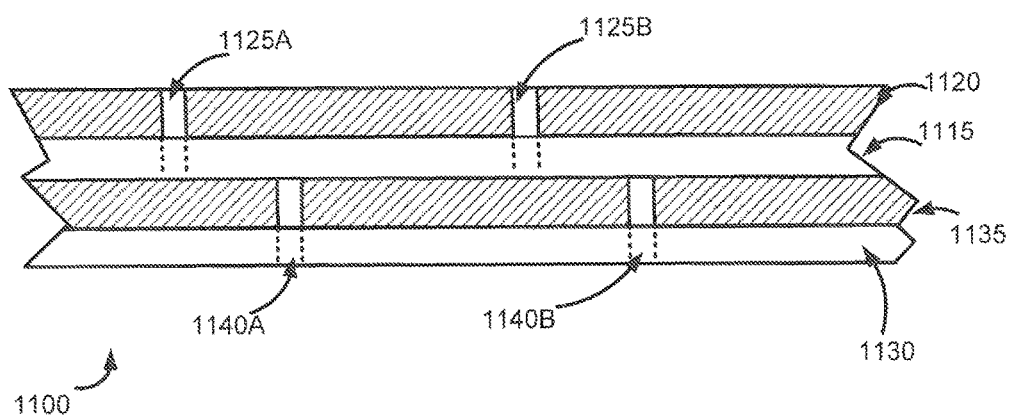

As desired in various embodiments, shield structures may be formed with a plurality of layers of electrically conductive material. For example, gaps or holes formed through a first layer of electrically conductive material may be covered by electrically conductive material included in a second layer. FIGS. 11A and 11B illustrate an example shield structure 1100 that includes a plurality of layers of electrically conductive material. With reference to FIG. 11, two separate shield structures 1105, 1110 may be formed. The first structure 1105 may include a base dielectric layer 1115 with electrically conductive material 1120 formed thereon. Additionally, longitudinally spaced gaps or holes, such as gaps 1125A and 1125B, may be formed through the electrically conductive material 1120 and the base layer 1115. Similarly, the second structure 1110 may include a base dielectric layer 1130 with electrically conductive material 1135 formed thereon. Longitudinally spaces gaps or holes, such as gasp 1140A and 1140B, may be formed through the electrically conductive material 1135 and the base dielectric layer 1130.

Once the two individual shield structures 1105, 1110 have been formed, the structures 1105, 1110 may be joined, bonded, or otherwise combined together in order to form an overall shield structure 1100, as illustrated by cross-section in FIG. 11B. In certain embodiments, the gaps or holes formed through a first of the component shield structures may be offset from the gaps or holes formed through a second of the component shield structures. In this regard, the electrically conductive material of each of the component shield structures may cover the gaps or holes formed through the other component shield structure. As a result, the overall shield structure 1100 may provide enhanced shielding as it may be more difficult for electrical signals to leak through or be transmitted through the shield structure 1100.

Figure 12:
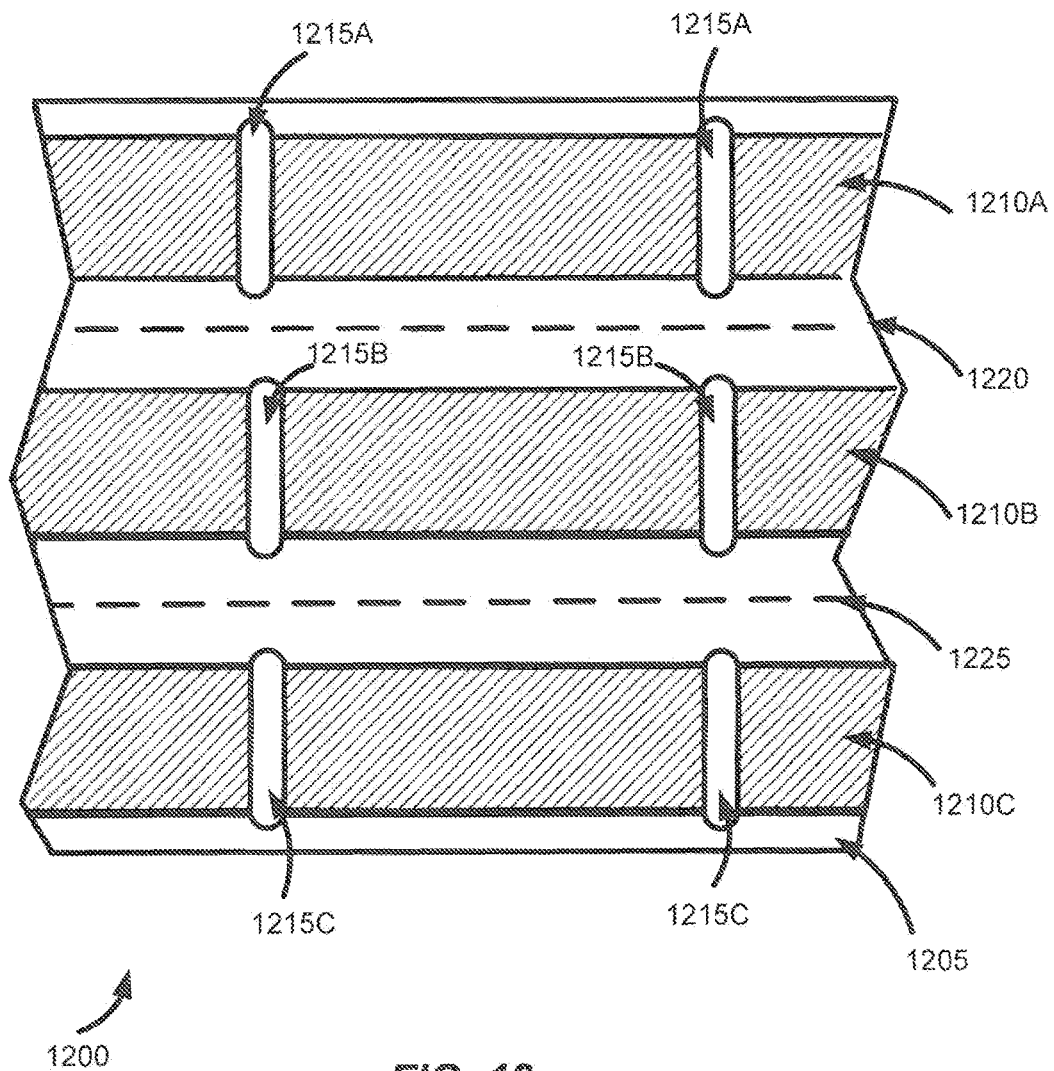

As described in greater detail above with reference to the system 400 of FIG. 4, in certain embodiments, a plurality of shield structures may be simultaneously formed utilizing a single base dielectric layer, and the individual shield structures may subsequently be separated from one another. FIG. 12 illustrates a top level view of example structure 1200 that may be cut or slit in order to form a plurality of discontinuous shield structures. As shown, the structure 1200 may include a base layer of dielectric material 1205, and a plurality of longitudinally extending strips 1210A, 1210B, 1210C of electrically conductive material may be formed on the base layer 1205. Although three strips of electrically conductive material are illustrated, any number of strips of electrically conductive material may be provided as desired. As desired, other components may be incorporated into the structure 1200, such as a sandwiching layer of dielectric material and/or any number of strength members.

The electrically conductive strips 1210A, 1210B, 1210C may extend along a longitudinal direction in parallel to one another. As shown, each of the strips 1210A, 1210B, 1210C may have widths that are approximately equal; however, in other embodiments, at least two strips may be formed with different widths. Additionally, adjacent strips may be spaced from one another along a widthwise dimension that is parallel to the longitudinal direction. In other words, a portion of the base layer 1205 may be present between each pair of adjacent strips along the widthwise dimension. With continued reference to FIG. 12, respective longitudinally spaced gaps or holes may be formed through each of the electrically conductive strips 1210A, 1210B, 1210C and the base layer 1205. For example, a first set of longitudinally spaced gaps 1215A may be formed through the first strip 1210A, a second set of longitudinally spaced gaps 1215B may be formed through the second strip 1210B, and a third set of longitudinally spaced gaps may be formed through the third strip 1210C. Each set of gaps may have a length that extends across the widthwise dimension by an amount that is greater than its associated electrically conductive strip.

Once the shield structure 1200 illustrated in FIG. 12 is formed, the structure 1200 may be slit or cut into a plurality of individual shield structures. For example, the structure 1200 may be slit along a longitudinal line 1220 positioned in a widthwise dimension between the first electrically conductive strip 1210A and the second electrically conductive strip 1210B. Similarly, the structure 1200 may be slit along a longitudinal line 1225 positioned in a widthwise dimension between the second electrically conductive strip 1210B and the third electrically conductive strip 1210C. In certain embodiments, a longitudinal slit may be formed such that one or more of the individual shield structures includes portions of the base layer 1205 that extend beyond the electrically conductive material along the widthwise edge at which the slit is formed.

A wide variety of other types of shield structures may be formed as desired in various embodiments. These shield structures may include any number of layers of material. Additionally, as desired, shield structures may be formed with a wide variety of suitable dimensions and/or configuration. For example, various components of a shield structure may have any suitable widths and/or thicknesses. Additionally, gaps may be formed in a wide variety of suitable configurations and/or at a wide variety of different angles. The shield structures illustrated in FIGS. 5A-12 are provided by way of non-limiting example only.

Example Method for Forming Discontinuous Shield Structures

Figure 13:
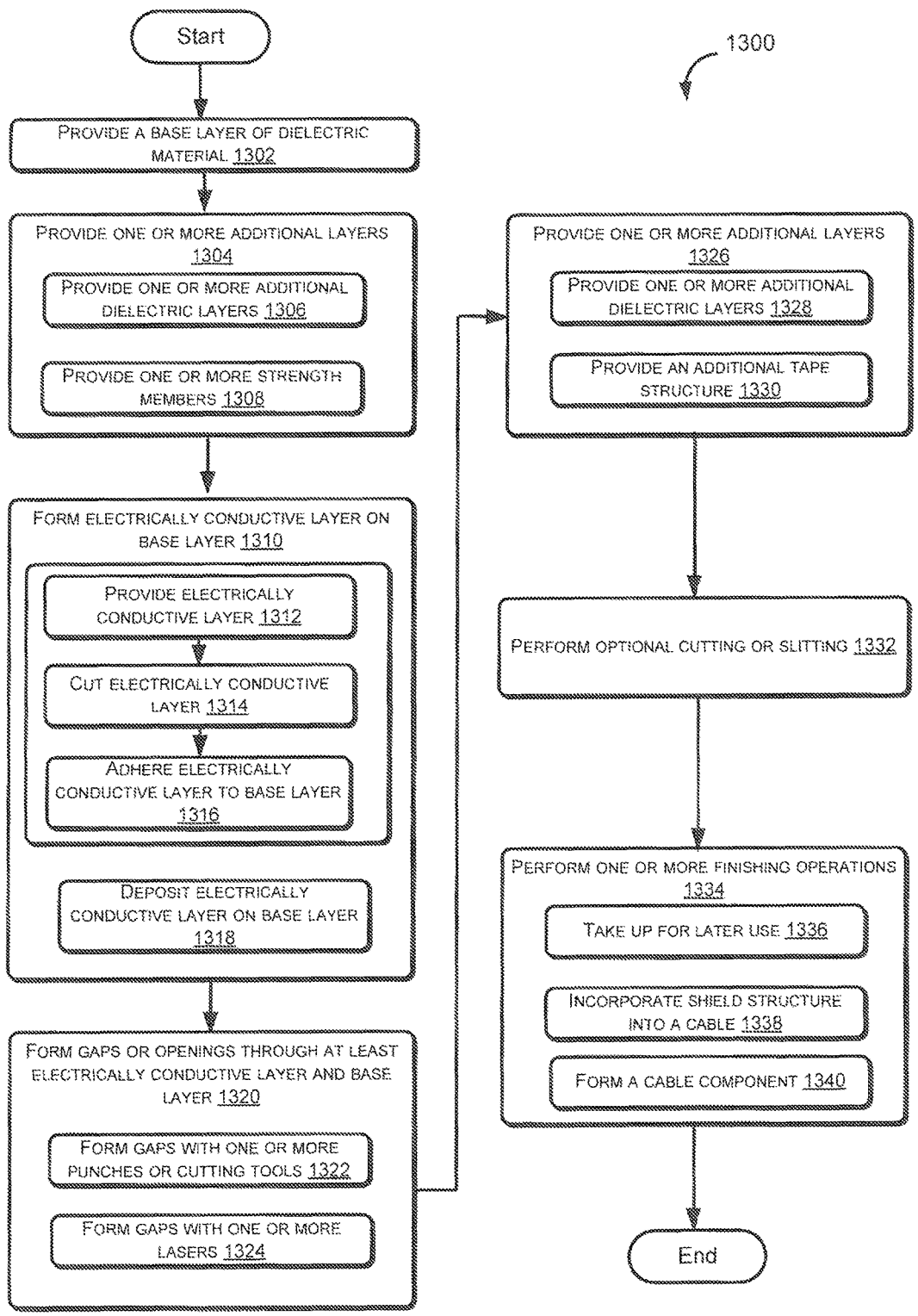
FIG. 13 is a flow diagram illustrating an example method for manufacturing or forming a discontinuous shield structure in accordance with various embodiments of the disclosure.

FIG. 13 is a flow diagram illustrating an example method 1300 for manufacturing or forming a discontinuous shield structure in accordance with various embodiments of the disclosure. Certain operations of the method 1300 may be performed by any number of suitable discontinuous shield structure manufacturing systems, such as one or more of the systems described above with reference to FIGS. 1-4. The method 1300 may begin at block 1302.

At block 1302, one or more base layers of dielectric material may be provided. For example, a base layer of dielectric material may be fed from a spool, bin, or other suitable source. A wide variety of suitable types of dielectric material may be provided as desired, such as a suitable plastic material or a suitable polymeric material. At bock 1304, one or more additional layers of material may optionally be provided. For example, one or more additional layers of dielectric material may be provided at block 1306, such as a "sandwiching" layer of dielectric material. As another example, one or more strength members, such as one or more strength yarns, may be provided at block 1308.

At block 1310, electrically conductive material may be formed on the base dielectric layer. A wide variety of suitable methods or techniques may be utilized to form electrically conductive material on the base dielectric layer. For example, at block 1312, one or more preformed electrically conductive layers, such as a metallic foil or a metal braid, may be provided. In certain embodiments, electrically conductive material may be supplied from one or more suitable spools, bins, or other sources. At block 1314, supplied electrically conductive material may optionally be cut or slit into a plurality of electrically conductive strips of material. The electrically conductive material or strips may then be adhered to, bonded to, or otherwise attached (e.g., attached with mechanical fasteners, etc.) to the base dielectric layer at block 1316. As desired, the electrically conductive material or strips may be "sandwiched" between two layers of dielectric material. As an alternative to forming an electrically conductive layer or strips from preformed electrically conductive material, an electrically conductive layer or electrically conductive strips may be deposited on the base dielectric layer at block 1318. For example, electrically conductive material may be sprayed, painted, extruded, or otherwise deposited on the base dielectric layer.

At block 1320, a plurality of longitudinally spaced gaps, holes, or openings may be formed through at least the electrically conductive layer and the base dielectric layer. In the event that a plurality of strips of electrically conductive material are provided, a respective plurality of longitudinally spaced gaps may be formed for each of the strips. A wide variety of suitable gap formation devices, components, and/or systems may be utilized to form gaps or openings as desired. For example, at block 1322, gaps may be formed with one or more suitable punches or cutting tools. As another example, at block 1324, gaps may be formed with one or more suitable lasers. As described in greater detail above, gaps may be formed with a wide variety of suitable dimensions, at a wide variety of angles, and/or with a wide variety of suitable configurations. Additionally, any suitable longitudinal spacing may be provided between any two of the gaps.

Following the formation of gaps, operations may continue at block 1326. At block 1326, one or more additional layers of material may optionally be provided. For example, at block 1328, one or more additional dielectric layers, such as a "sandwiching" dielectric layer may be provided. In this regard, a "sandwiching" layer may be provided that does not include gaps, thereby providing additional support to the shield structure. As another example, at block 1330, one or more additional shield structures, such as one or more additional shield tape structures may be provided. In certain embodiments, an additional shield structure may include an electrically conductive layer and one or more layers of dielectric material, and longitudinally spaced gaps may be formed through at least the electrically conductive layer and a base dielectric layer. An additional shield structure may be formed in a similar manner as that described above with reference to blocks 1302-1324. Additionally, in certain embodiments, when an additional shield structure is provided and joined with the original shield structure, the gaps formed in each of the structures may be longitudinally offset from one another.

At block 1332, a shield structure may optionally be cut or slit in order to form a plurality of separate or individual shield structures. For example, if a plurality of strips of electrically conductive material are formed on a base dielectric layer, the base dielectric layer (and any other dielectric layers) may be slit at one or more lines that longitudinally extend between the strips in a widthwise dimension.

Finally, at block 1334, one or more finishing operations may be performed. In certain embodiments, one or more manufactured shield structures may be taken up or collected at block 1336 for subsequent use. Alternatively, at block 1338, one or more shield structures may be incorporated into a cable. For example, a shield structure may be provided to a cable assembly process or system in a continuous or in-line manner, and the shield structure may be incorporated into the cable. In yet other embodiments, at block 1340, one or more shield structures may be formed into one or more suitable cable components, such as a separator configured to be positioned between two or more twisted pairs in a cable. The method 1300 may end following block 1334.

As desired in various embodiments, the method 1300 may include more or less operations than those described above with reference to FIG. 13. Additionally, in certain embodiments, any number of the described operations may be carried out or performed in parallel. The described method 1300 is provided by way of non-limiting example only.

Example Cable Constructions

Figure 14:
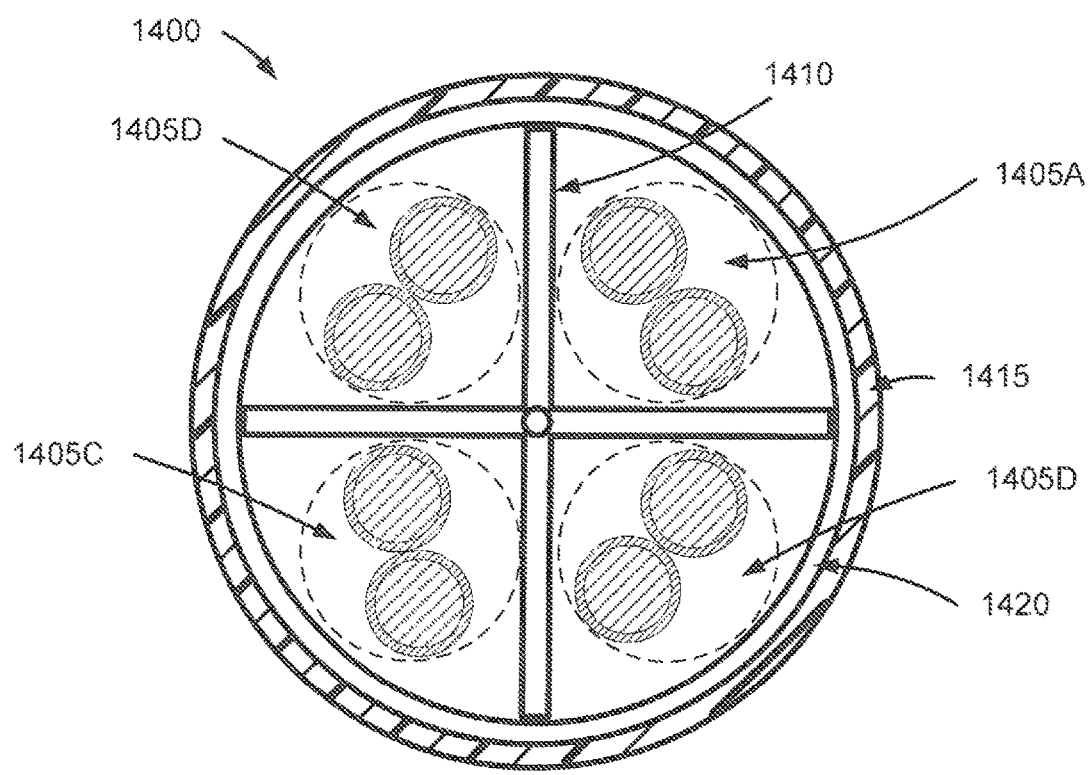
FIGS. 14-16 are cross-sectional views of example cables that may incorporate discontinuous shield structures, according to illustrative embodiments of the disclosure.
Figure 15:
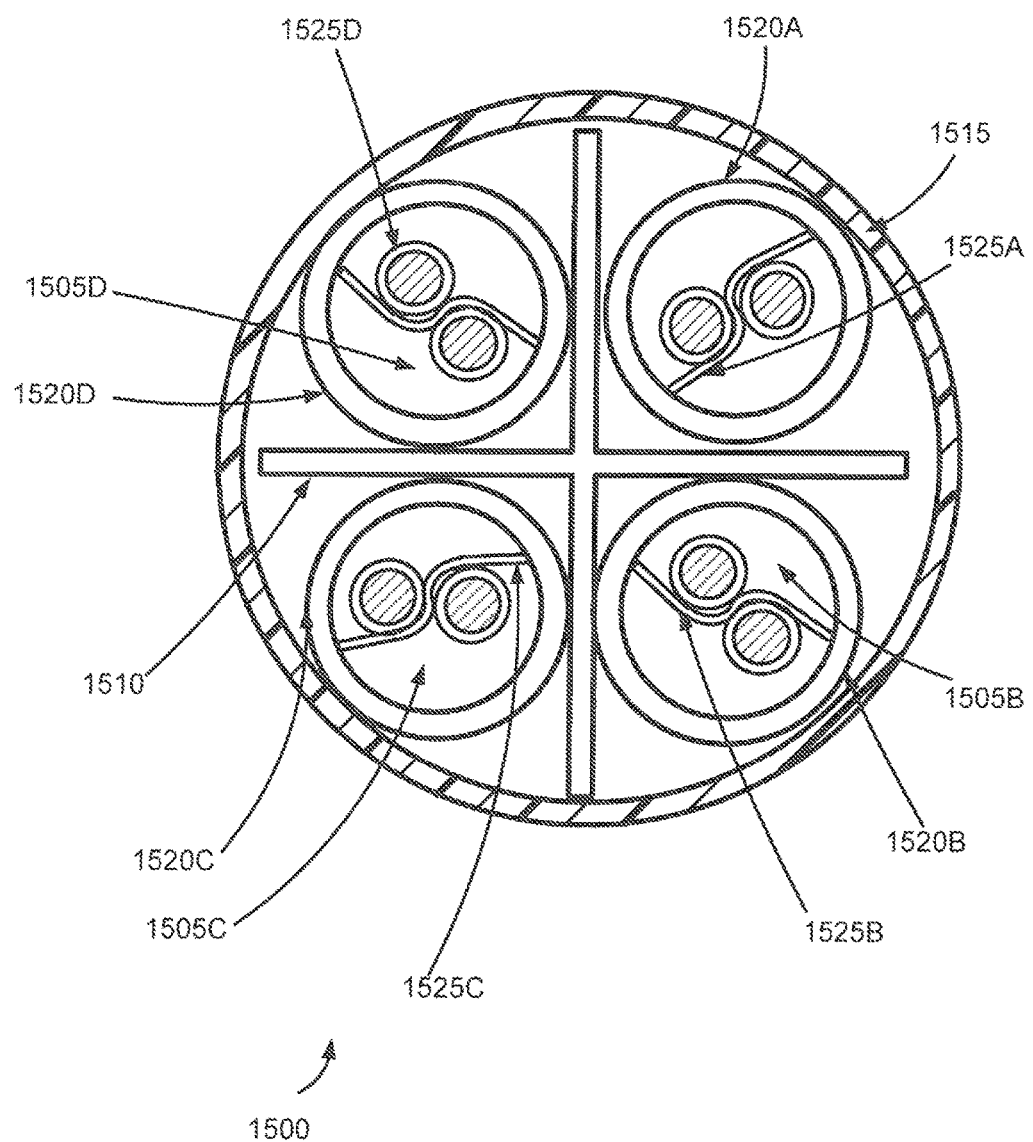
Figure 16:
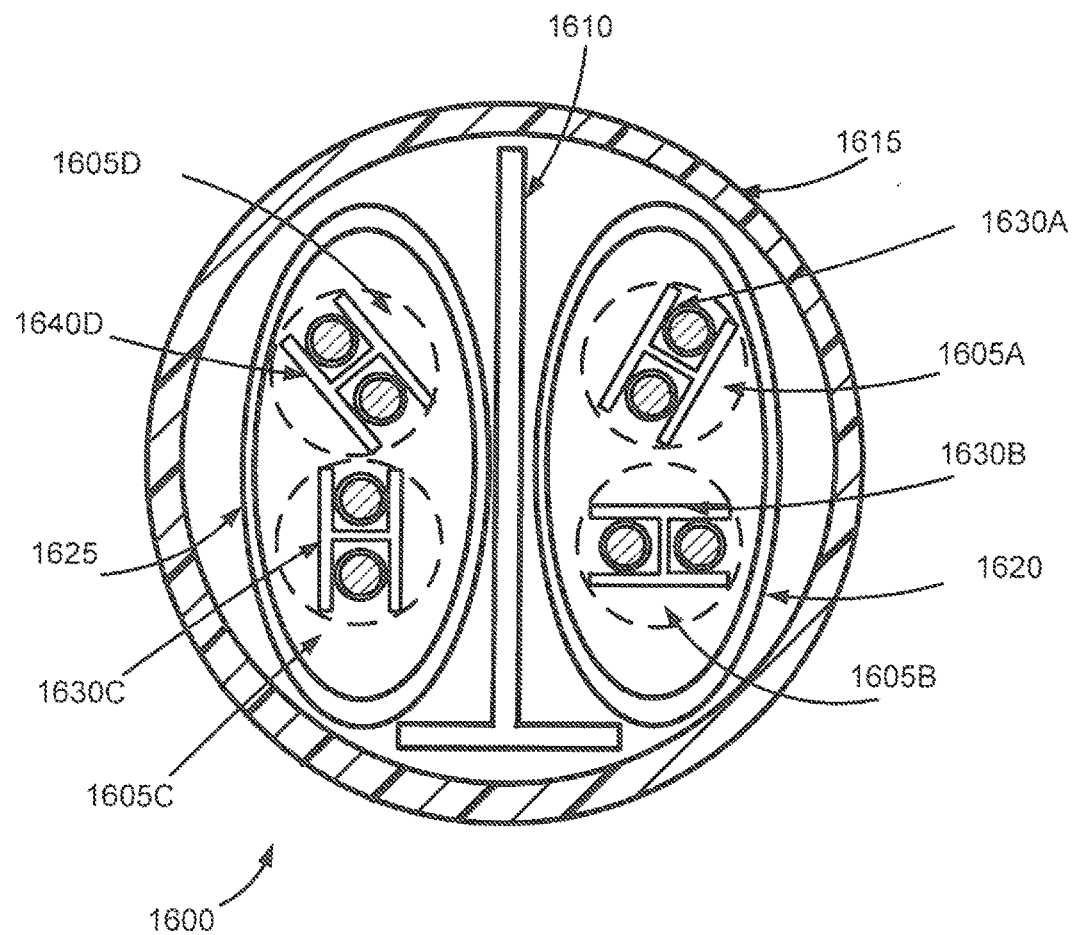

The discontinuous shield structures discussed herein may be incorporated into a wide variety of suitable types of cables, such as twisted pair communication cables, hybrid or composite cables (e.g., cables that include a combination of twisted pairs and other transmission media, etc.) riser cables, plenum cables, horizontal cables, vertical cables, flexible cables, equipment cords, cross-connect cables, etc. Additionally, the discontinuous shield structures may be utilized to form a wide variety of suitable cable components, such as a twisted pair separator or a shield layer. FIGS. 14-16 are cross-sectional views of example cables that may incorporate discontinuous shield structures, according to illustrative embodiments of the disclosure.

With reference to FIG. 14, a cross-section of an example cable 1400 that may be utilized in various embodiments is illustrated. The cable 1400 is illustrated as a twisted pair communications cable that includes four twisted pairs 1405A, 1405B, 1405C, 1405D; however, any other suitable number of pairs may be utilized. Each twisted pair (referred to generally as twisted pair 1405) may include two electrical conductors, each covered with suitable insulation. The electrical conductors of a twisted pair 1405 may be formed from any suitable electrically conductive material, such as copper, aluminum, silver, annealed copper, gold, a conductive alloy, etc. Additionally, the electrical conductors may have any suitable diameter, gauge, and/or other dimensions. The twisted pair insulation may include any suitable dielectric materials and/or combination of materials. Additionally, the insulation may be formed from a single layer or a plurality of layers of material. Each of the twisted pairs may also have any suitable twist length and/or twist direction.

A jacket 1415 may enclose the internal components of the cable 1400, seal the cable 1400 from the environment, and/or provide strength and structural support. The jacket 1415 may be formed from a wide variety of suitable materials and/or combinations of materials, such as one or more polymeric materials, one or more polyolefins (e.g., polyethylene, polypropylene, etc.), polyvinyl chloride ("PVC"), one or more flame retardant olefins, a low smoke zero halogen ("LSZH") material, etc. The jacket 1415 may be formed as a single layer or, alternatively, as multiple layers.

With continued reference to FIG. 14, the cable 1400 may include an overall or external shield layer 1420, such as a shield layer positioned around the collection of twisted pairs 1405A-D. In certain embodiments, the shield layer 1420 may be formed from a discontinuous shield structure manufactured or otherwise provided in accordance with the disclosure set forth herein. For example, the shield layer 1420 may be formed from one of the discontinuous shield structures discussed above with reference to FIGS. 5A-12. Accordingly, the shield layer 1420 may include a plurality of discontinuous patches of electrically conductive material.

A wide variety of suitable methods or techniques may be utilized as desired to incorporate a discontinuous shield structure into the cable 1400 as a shield layer. For example, one or more cable components (e.g., the twisted pairs 1405A-D, etc.) may be positioned adjacent to the shield structure. The shield structure may then be folded at one or both edges such that it is circumferentially wrapped around the desired cable components. In certain embodiments, the shield structure may be passed through one or more suitable dies that function to wrap the shield structure into a shield layer.

With continued reference to FIG. 14, in certain embodiments, the cable 1400 may include a separator 1410 configured to orient and or position one or more of the twisted pairs 1405A-D. For example, a separator 1410 may be positioned between at least two of the twisted pairs 1405A-D. The orientation of the twisted pairs 1405A-D relative to one another may provide beneficial signal performance. As desired in various embodiments, the separator 1410 may be formed in accordance with a wide variety of suitable dimensions, shapes, or designs. For example, a flat tape separator, an X-shaped or cross-shaped separator, a T-shaped separator, a Y-shaped separator, a J-shaped separator, an L-shaped separator, a diamond-shaped separator, a separator having any number of spokes extending from a central point, a separator having walls or channels with varying thicknesses, a separator having T-shaped members extending from a central point or center member, a separator including any number of suitable fins, and/or a wide variety of other shapes may be utilized. In certain embodiments, a tape may be formed into a desired shape utilizing a wide variety of folding and/or shaping techniques. For example, a separator 1410 may be formed from be formed from a discontinuous shield structure manufactured or otherwise provided in accordance with the disclosure set forth herein.

A wide variety of suitable methods or techniques may be utilized as desired to form a discontinuous shield structure into a separator. For the example separator 1410 illustrated in FIG. 14, a discontinuous shield structure may first be formed into a shape having a relatively circular cross-section. For example, the widthwise edges of the separator may be brought into contact with one. In certain embodiments, the shield structure may be passed through one or more suitable dies that function to wrap the edges of the structure. The shield structure may then be passed through one or more dies that mash the structure into a shape having an "X" or cross shape. In other embodiments, other components may fold various edges of a shield structure in order to form an "X" or cross-shape. Additionally, similar techniques and/or systems may be utilized to form a shield structure into a separator having a desired cross-sectional shape.

FIG. 15 illustrates a cross-sectional view of another example cable 1500 that may incorporate one or more discontinuous shield structures. Similar to the cable 1400 discussed above with reference to FIG. 14, the cable 1500 may include a plurality of twisted pairs 1505A-D, and a jacket 1515 may be formed around the twisted pairs 1505A-D. Additionally, in certain embodiments, a suitable separator 1510 may be positioned between at least two of the twisted pairs 1505A-D. As desired, the separator 1510 may be formed from a discontinuous shield structure manufactured or otherwise provided in accordance with the disclosure set forth herein.

In contrast to the cable of FIG. 14, each of the twisted pairs 1505A-D of the cable 1500 may be individually shielded. For example, shield layers 1520A-D may respectively be wrapped or otherwise formed around each of the twisted pairs 1505A-D. In other words, a first shield layer 1520A may be formed around a first twisted pair 1505A, a second shield layer 1520B may be formed around a second twisted pair 1505B, a third shield layer 1520C may be formed around a third twisted pair 1505C, and a fourth shield layer 1520D may be formed around a fourth twisted pair 1505D. In other embodiments, a portion or none of the twisted pairs may be individually shielded. Indeed, a wide variety of different shielding arrangements may be utilized in accordance with various embodiments of the disclosure. In certain embodiments, at least one of the shield layers may be formed from a discontinuous shield structure manufactured or otherwise provided in accordance with the disclosure set forth herein.

With continued reference to FIG. 15, in certain embodiments, respective dielectric separators 1525A-D may be woven helically between the individual conductors or conductive elements of one or more of the twisted pairs 1505A-D. In other words, a dielectric separator (generally referred to as dielectric separator 1525) may be helically twisted with the conductors of a twisted pair 1505 along a longitudinal length of the cable 1500. In certain embodiments, the dielectric separator 1530 may maintain spacing between the individual conductors of the twisted pair 1505. As illustrated in FIG. 15, a dielectric separator 1525 may be formed as a relatively simple film layer that is positioned between the individual conductors of a twisted pair 1505. In other embodiments, such as the embodiment illustrated in FIG. 16, a dielectric separator 1525 may be formed with a cross-section (e.g., an X-shaped cross-section, an H-shaped cross-section, etc.) that additionally assists in maintaining the position(s) of one or both the individual conductors of a twisted pair. In other words, the dielectric separator may reduce or limit the ability of one or both of the individual conductors to shift, slide, or otherwise move in the event that certain forces, such as compressive forces, are exerted on the cable 1500. As desired in certain embodiments, a dielectric separator may be formed from a discontinuous shield structure manufactured or otherwise provided in accordance with the disclosure set forth herein.

FIG. 16 illustrates a cross-sectional view of another example cable 1600 that may incorporate one or more discontinuous shield structures. The cable 1600 of FIG. 16 may include components that are similar to the cables 1400, 1500 illustrated and described above with reference to FIGS. 14 and 15. Accordingly, the cable 1600 may include a plurality of twisted pairs 1605A-D disposed in a cable core. A separator 1610 may be disposed between at least two of the twisted pairs 1605A-D and may function to orient and/or provide desired spacing between two or more of the twisted pairs 1605A-D. An outer jacket 1615 may enclose the internal components of the cable 1600.

The separator 1610 illustrated in FIG. 16 has a different cross-sectional shape than the separators 1410, 1510 illustrated in FIGS. 14 and 15. In particular, the separator 1610 is a generally T-shaped separator that approximately bisects (or otherwise divides) the cable core and forms two channels along a longitudinal length of the cable 1600 in which the twisted pairs 1605A-D are disposed. For example, two twisted pairs 1605A, 1605B can be disposed in a first channel and the remaining two twisted pairs 1605C, 1605D can be disposed in a second channel. The T-shaped separator 1610 illustrated in FIG. 16 is merely one example of an alternative separator shape, and a wide variety of other separator shapes may be utilized as desired. Additionally, in certain embodiments, the separator 1610 may be formed from a discontinuous shield structure manufactured or otherwise provided in accordance with the disclosure set forth herein.

Additionally, any number of shield layers may be utilized to provide shielding for the twisted pairs 1605A-D. For example, a first shield layer 1620 may be wrapped or otherwise formed around two of the twisted pairs, such as the twisted pairs 1605A, 1605B disposed in the first channel. A second shield layer 1625 may be wrapped or otherwise formed around other twisted pairs, such as twisted pairs 1605C, 1605D disposed in the second channel. In other words, shield layers may be provided for various groups of twisted pairs disposed within the cable core. In certain embodiments, the one or more of the shield layers 1620, 1625 may be formed from a discontinuous shield structure manufactured or otherwise provided in accordance with the disclosure set forth herein.

With continued reference to FIG. 16, respective dielectric separators 1630A-D having an H-shaped cross-section may be disposed or positioned between the individual conductors of the various twisted pairs 1605A-D. As described in greater detail above with reference to FIG. 15, these dielectric separators 1630A-D may assist in maintaining the position(s) of one or both the individual conductors of the twisted pairs 1605A-D. Dielectric separators may also be formed with a wide variety of other cross-sectional shapes and/or dimensions. Additionally, in certain embodiments, one or more of the dielectric separators 1630A-D may be formed from a discontinuous shield structure manufactured or otherwise provided in accordance with the disclosure set forth herein.

As desired in various embodiments, a wide variety of other materials may be incorporated into a cable, such as the cables 1400, 1500, 1600 illustrated in FIGS. 14-16. For example, a cable may include any number of conductors, twisted pairs, optical fibers, and/or other transmission media. In certain embodiments, one or more tubes or other structures may be situated around various transmission media and/or groups of transmission media. Additionally, as desired, a cable may include a wide variety of strength members, swellable materials (e.g., aramid yarns, blown swellable fibers, etc.), insulating materials, dielectric materials, flame retardants, flame suppressants or extinguishants, gels, and/or other materials. The cables illustrated in FIGS. 14-16 are provided by way of example only. Other cables may include more or less components than the cables illustrated in FIGS. 14-16. Additionally, certain components may have different dimensions and/or materials than the components illustrated in FIGS. 14-16.

Conditional language, such as, among others, "can," "could," "might," or "may," unless specifically stated otherwise, or otherwise understood within the context as used, is generally intended to convey that certain embodiments could include, while other embodiments do not include, certain features, elements, and/or operations. Thus, such conditional language is not generally intended to imply that features, elements, and/or operations are in any way required for one or more embodiments or that one or more embodiments necessarily include logic for deciding, with or without user input or prompting, whether these features, elements, and/or operations are included or are to be performed in any particular embodiment.

Many modifications and other embodiments of the disclosure set forth herein will be apparent having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method for forming a discontinuous shield for use in a cable, the method comprising:

providing a first layer of dielectric material, the first layer extending in a longitudinal direction and having a first width across a width direction perpendicular to the longitudinal direction;

forming a second layer of electrically conductive material on the first layer of dielectric material, the second layer extending in the longitudinal direction and having a second width across the width direction that is less than the first width; and forming, at a plurality of locations along the longitudinal direction, respective gaps through both the first layer and the second layer, each gap spanning across the width direction by a distance greater than the second width but less than the first width.

2. The method of claim 1, wherein forming a second layer of electrically conductive material comprises providing one of (i) a metal foil layer or (ii) a metal screen layer.

3. The method of claim 1, wherein forming a second layer of electrically conductive material on the first layer comprises adhering the second layer to the first layer.

4. The method of claim 1, wherein forming gaps comprises forming gaps with one of (i) a punch, (ii) a blade, or (iii) a laser.

5. The method of claim 1, wherein forming gaps comprises forming at least one gap spanning across the width direction at an angle that is perpendicular to the longitudinal direction.

6. The method of claim 1, wherein forming gaps comprises forming at least one gap spanning across the width direction at an angle that is not perpendicular to the longitudinal direction.

7. The method of claim 1, wherein forming a second layer of electrically conductive material on the first layer of dielectric material comprises forming a plurality of layers of electrically conductive material that extend in parallel in the longitudinal direction, and
wherein forming gaps comprises forming respective gaps corresponding to each respective layer of electrically conductive material.

8. The method of claim 7, wherein forming a plurality of layers of electrically conductive material comprises:
providing a single layer of electrically conductive material;
cutting the single layer of electrically conductive material into a plurality of components; and
adhering the plurality of components to the first layer of dielectric material.

9. The method of claim 7, further comprising:
cutting, subsequent to forming gaps, the first layer of dielectric material along the longitudinal direction between two layers of electrically conductive material.

10. The method of claim 1, wherein the first layer of dielectric material is positioned on a first side of the second layer of electrically conductive material, and further comprising:
providing a third layer of dielectric material on an opposite side of the second layer of electrically conductive material.

11. The method of claim 10, wherein providing a third layer of dielectric material comprises providing a third layer of dielectric material following the formation of gaps.

12. The method of claim 10, further comprising:
providing at least one strength member between the first layer of dielectric material and the third layer of dielectric material, wherein the at least one strength member extends in the longitudinal direction parallel to the second layer of electrically conductive material.

13. The method of claim 1, further comprising:
subsequent to forming gaps and without taking up the discontinuous shield, incorporating the discontinuous shield into a cable comprising one or more transmission media.

14. A method for forming a discontinuous shield for use in a cable, the method comprising:
providing a longitudinally extending shield comprising a dielectric substrate and electrically conductive material, wherein the dielectric substrate extends beyond the electrically conductive material on opposite edges in a width dimension perpendicular to the longitudinal direction; and
forming spaced openings through the shield at a plurality of locations along the longitudinal direction, wherein each opening extends across the electrically conductive material and partially across the dielectric substrate on opposite sides of the electrically conductive material without extending completely across the dielectric substrate in the width dimension.

15. The method of claim 14, wherein forming spaced openings comprises forming openings with one of (i) a punch, (ii) a blade, or (iii) a laser.

16. The method of claim 14, wherein providing a longitudinally extending shield comprising providing a shield having a plurality of layers of electrically conductive material extending in parallel along the dielectric substrate,
wherein forming spaced openings through the shield comprises forming respective openings corresponding to each layer of electrically conductive material, and further comprising:
cutting, subsequent to forming spaced openings, the dielectric material along the longitudinal direction between two layers of electrically conductive material.

17. The method of claim 14, wherein the dielectric substrate is positioned on a first side of the electrically conductive material, and further comprising:
providing a second layer of dielectric material on an opposite side of the electrically conductive material.

18. The method of claim 17, wherein providing a second layer of dielectric material comprises providing a second layer of dielectric material following the formation of spaced openings.

19. A method for forming a discontinuous shield for use in a cable, the method comprising:
providing a longitudinally extending dielectric layer;
adhering longitudinally extending electrically conductive material to the dielectric layer, the electrically conductive material spanning partially across the dielectric layer in a width dimension; and
forming longitudinally spaced gaps through both the dielectric layer and the electrically conductive material, each gap spanning across the electrically conductive material and partially across the dielectric substrate on opposite sides of the electrically conductive material without spanning completely across the dielectric layer in the width dimension.

20. The method of claim 19, wherein forming gaps comprises forming gaps with one of (i) a punch, (ii) a blade, or (iii) a laser.

* * * * *